(12) United States Patent
Aoki

(10) Patent No.: US 7,659,567 B2
(45) Date of Patent: Feb. 9, 2010

(54) SEMICONDUCTOR DEVICE FEATURING COMMON CAPACITOR ELECTRODE LAYER, AND METHOD FOR MANUFACTURING SUCH SEMICONDUCTOR DEVICE

(75) Inventor: Yasuyuki Aoki, Yamagata (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 95 days.

(21) Appl. No.: 11/656,532

(22) Filed: Jan. 23, 2007

(65) Prior Publication Data

US 2007/0173012 A1 Jul. 26, 2007

(30) Foreign Application Priority Data

Jan. 25, 2006 (JP) ............................. 2006-016770

(51) Int. Cl.
*H01L 27/108* (2006.01)
(52) U.S. Cl. ................ 257/306; 257/307; 257/E27.088
(58) Field of Classification Search ......... 438/253–256, 438/396–399; 257/306–311, 295, E27.088
See application file for complete search history.

(56) References Cited

U.S. PATENT DOCUMENTS 6,395,600 B1 * 5/2002 Durcan et al. ................ 438/253
6,528,366 B1 * 3/2003 Tu et al. ...................... 438/253
2003/0092235 A1 * 5/2003 Kanaya et al. .............. 438/240

FOREIGN PATENT DOCUMENTS

JP 2004-235246 8/2004
JP 2005-5337 1/2005

* cited by examiner

*Primary Examiner*—H. Jey Tsai
(74) *Attorney, Agent, or Firm*—McGinn IP Law Group, PLLC

(57) ABSTRACT

In a semiconductor device, a semiconductor substrate is sectioned into a logic-circuit formation section in which a plurality of logic circuits are formed, and a memory formation section in which a plurality of memory cells are formed. A multi-layered insulating layer is formed on the substrate, and a conductive structure is formed in the insulating layer at the logic-circuit formation section. Capacitors are formed in the insulating layer at the memory formation section. Each of the capacitors includes a lower capacitor electrode, a capacitor dielectric layer formed on the lower capacitor electrode, and an upper capacitor electrode formed on the capacitor dielectric layer, with upper is end faces of the upper capacitor electrodes being coplanar with an upper end face of the conductive structure. Bit-line layers are formed in the insulating layer below the lower capacitor electrodes at the memory formation section. A signal-line layer is formed in the insulating layer on or above the conductive structure at the logic-circuit formation section so as to be electrically connected to the conductive structure. An upper-side connection layer are formed in the insulating layer at the memory formation section on or above the capacitors so as to be electrically connected to the upper capacitor electrodes.

20 Claims, 23 Drawing Sheets

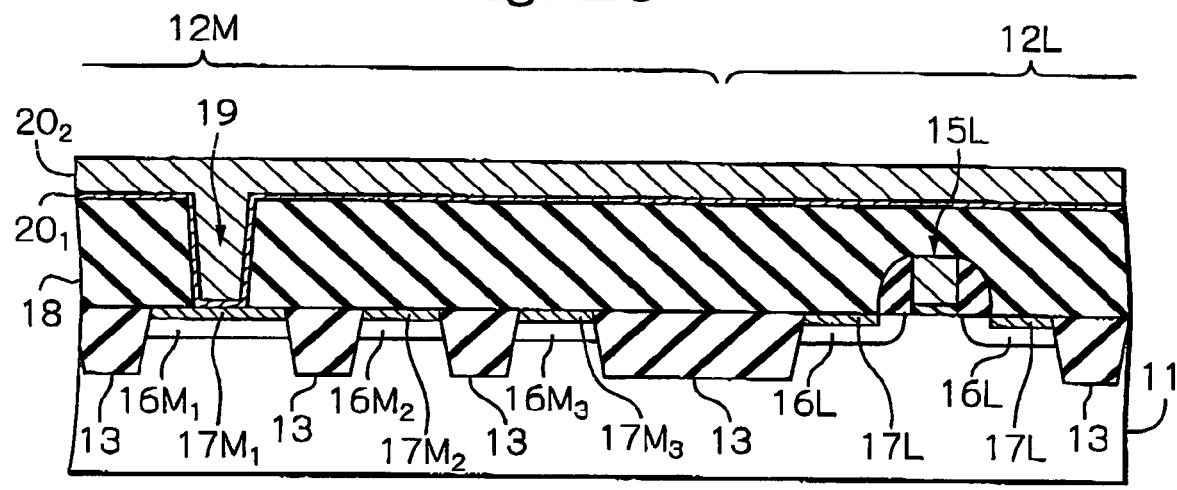
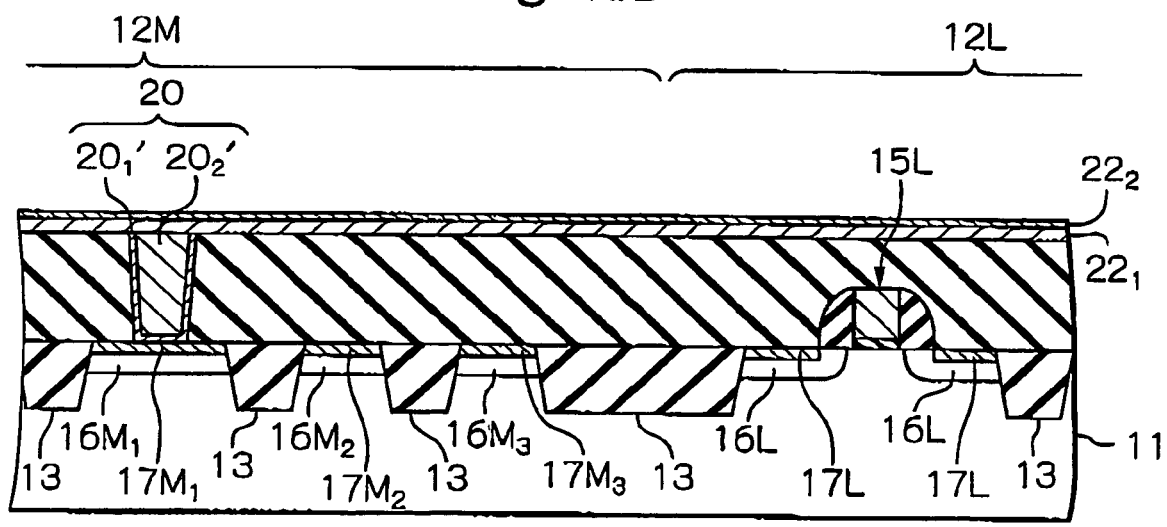

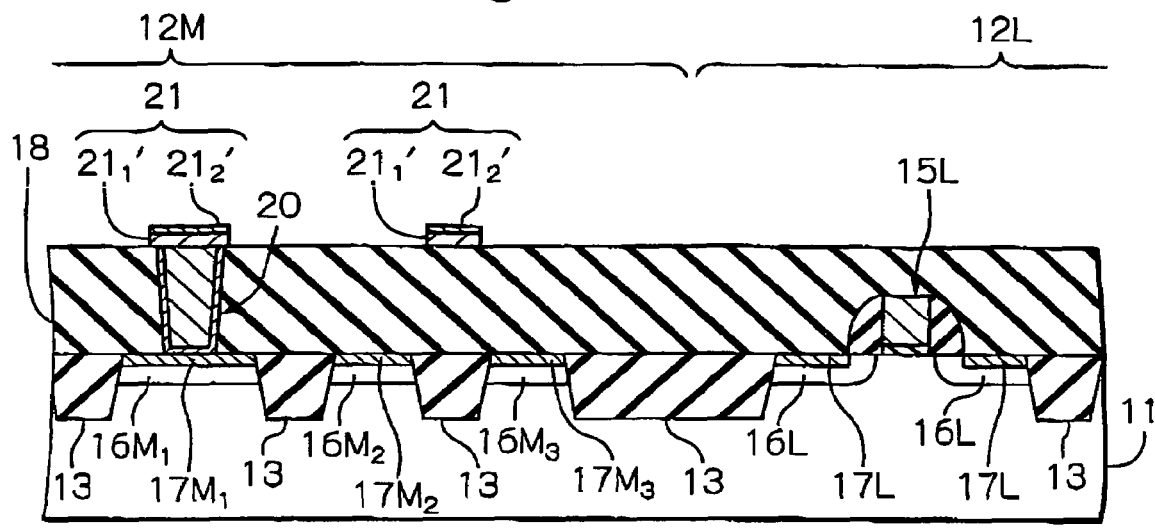
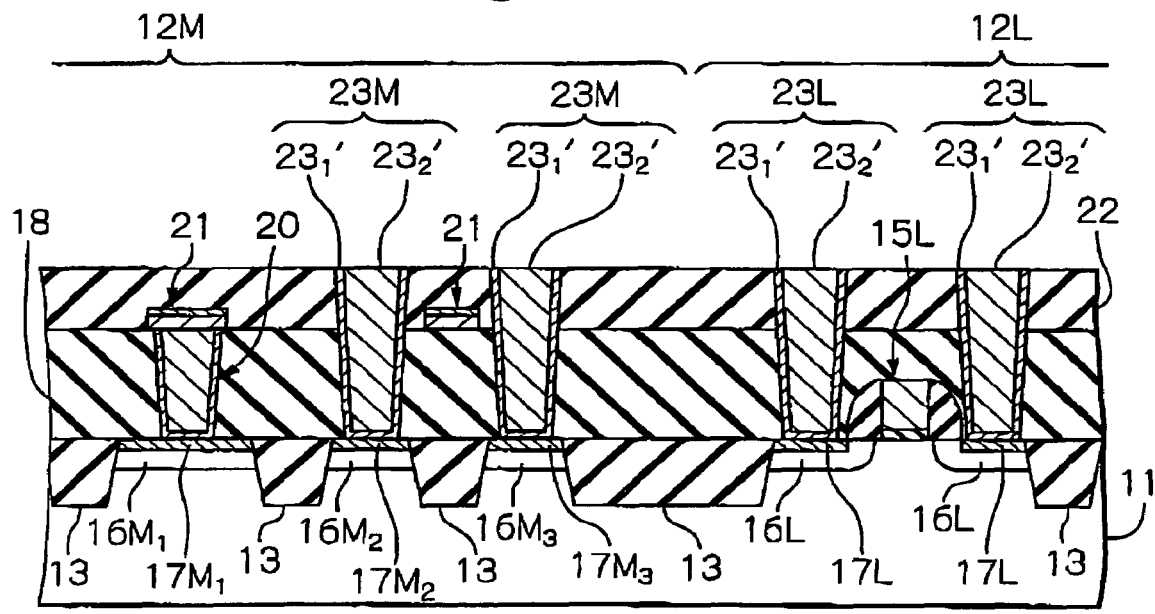

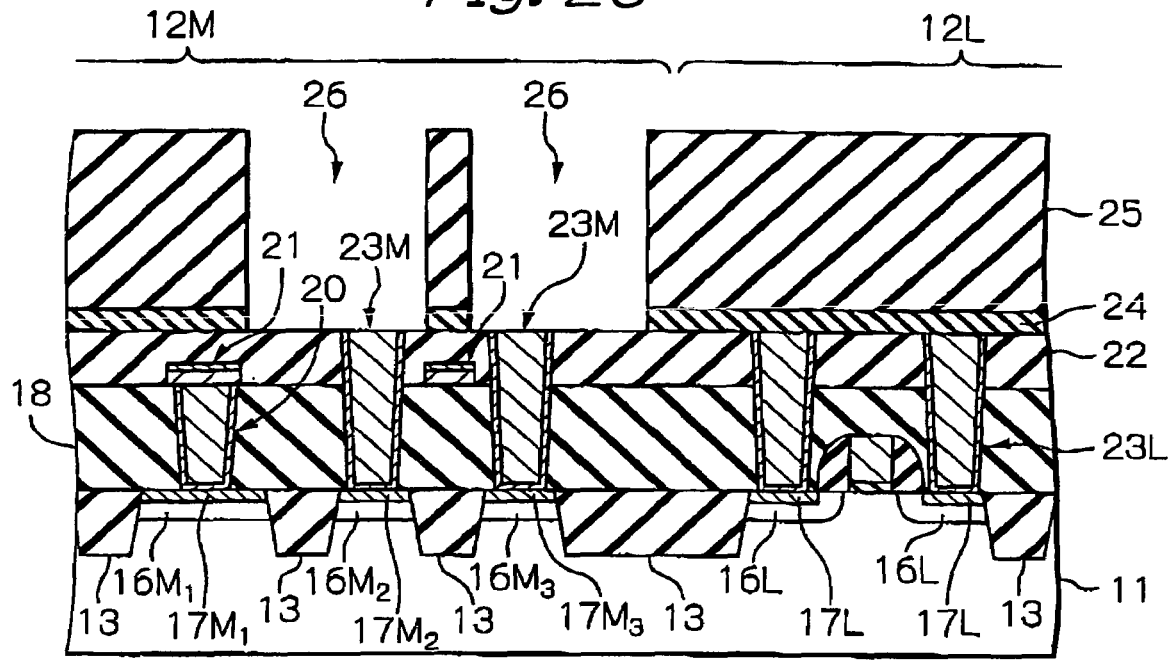
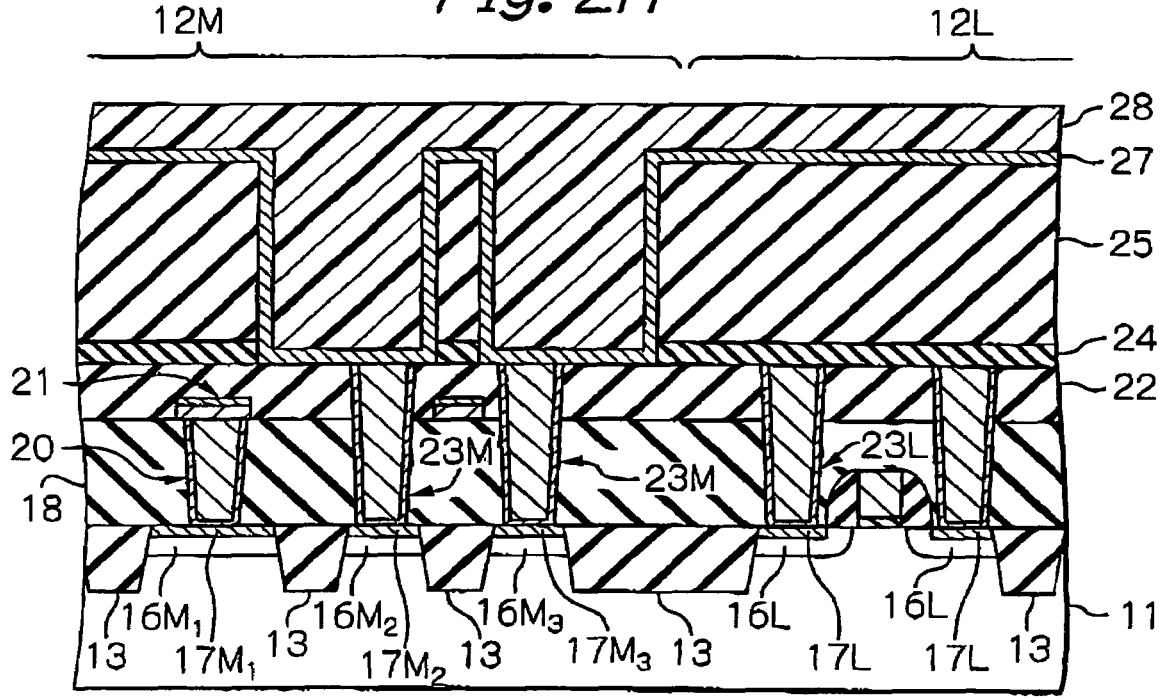

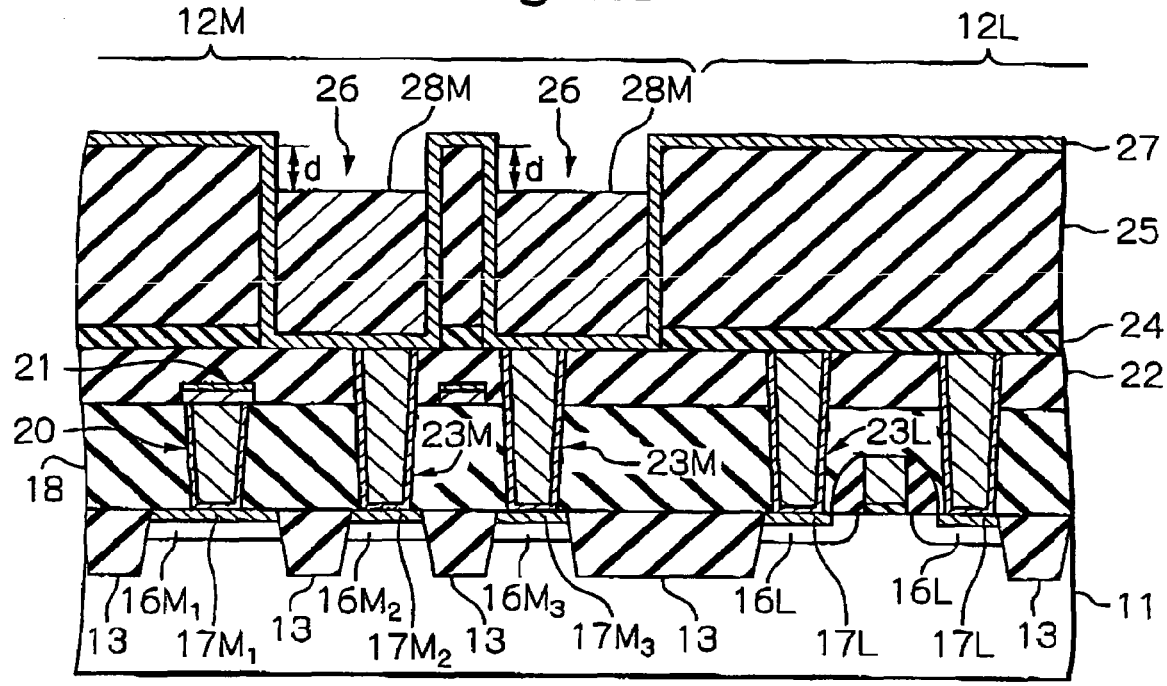
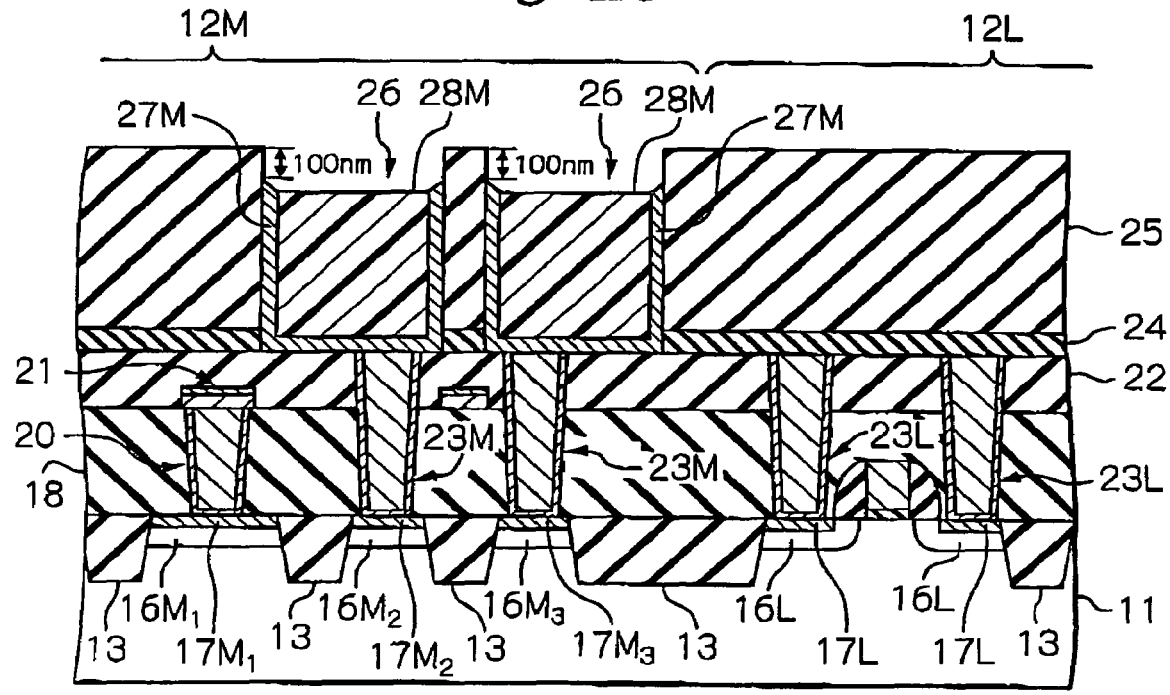

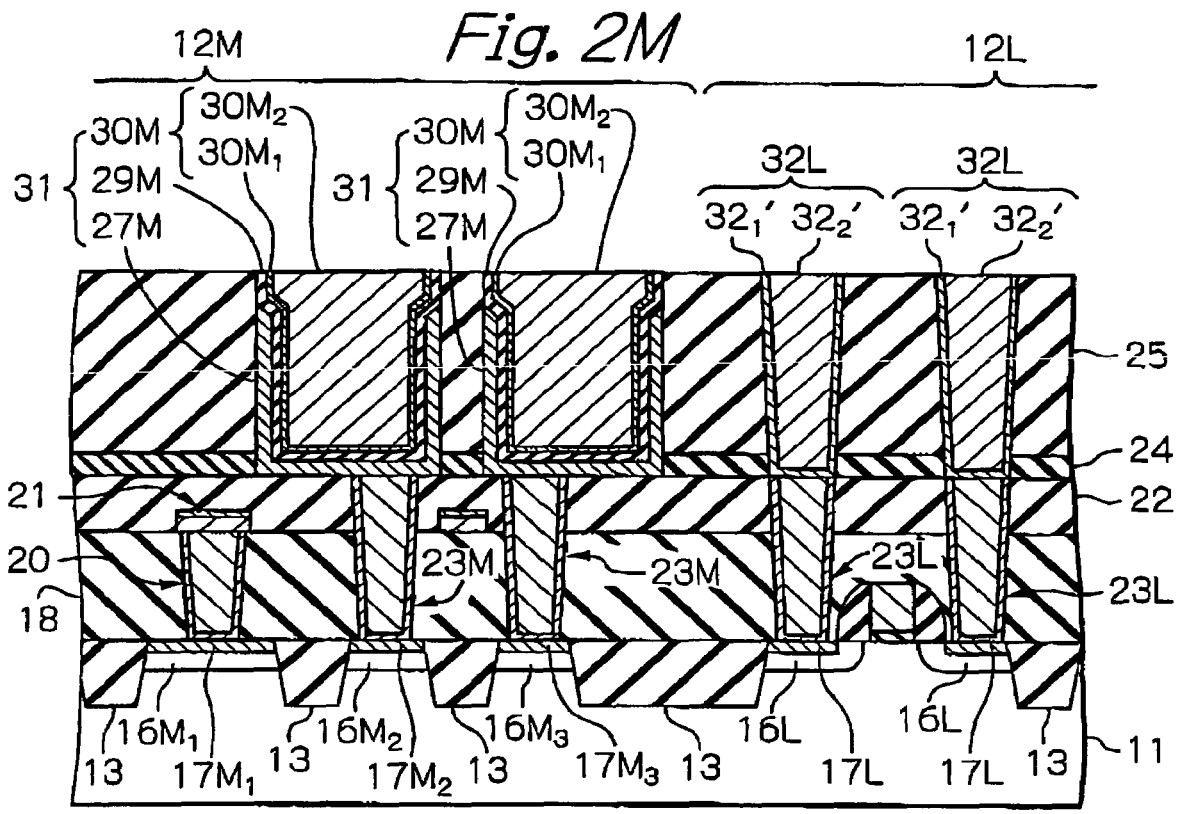
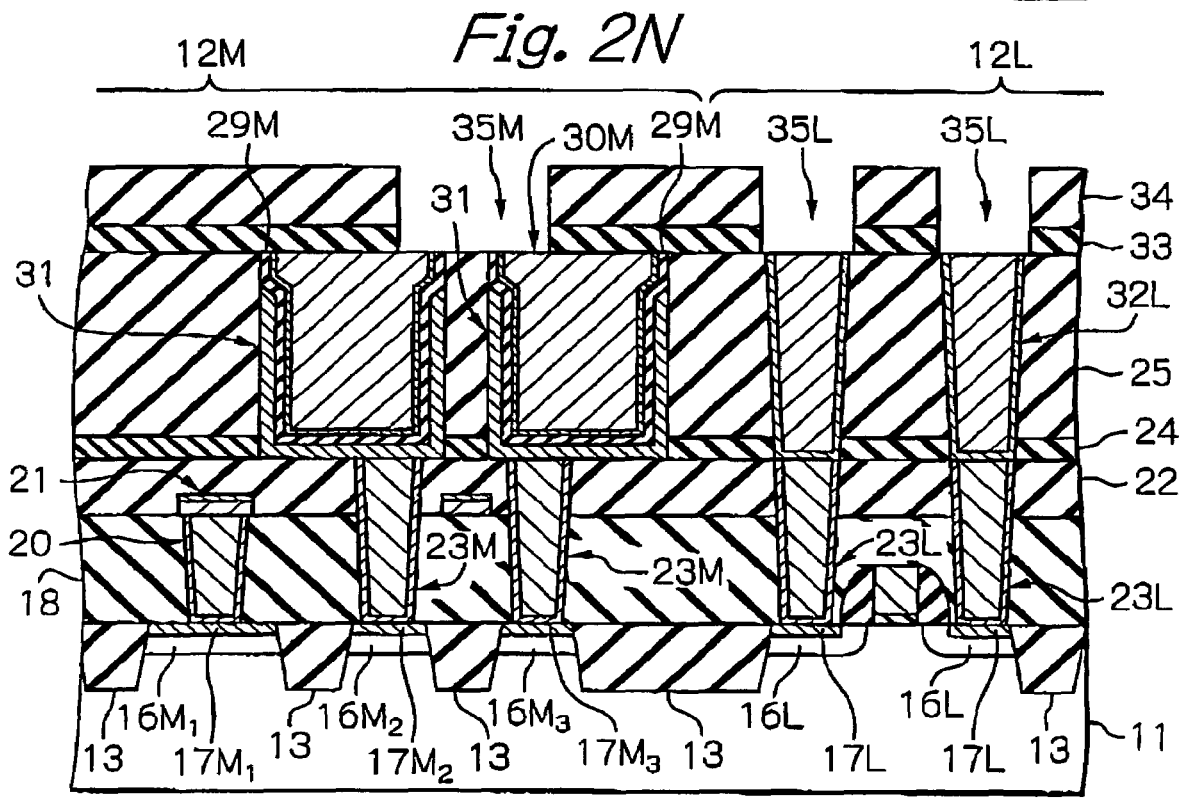

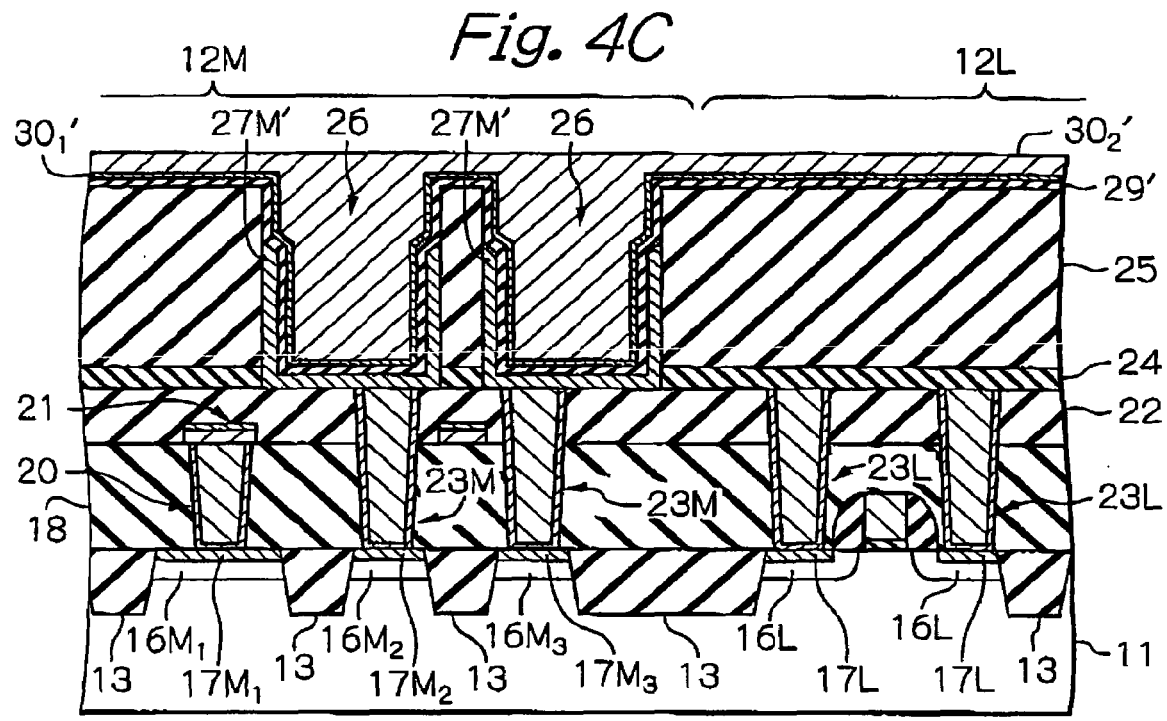
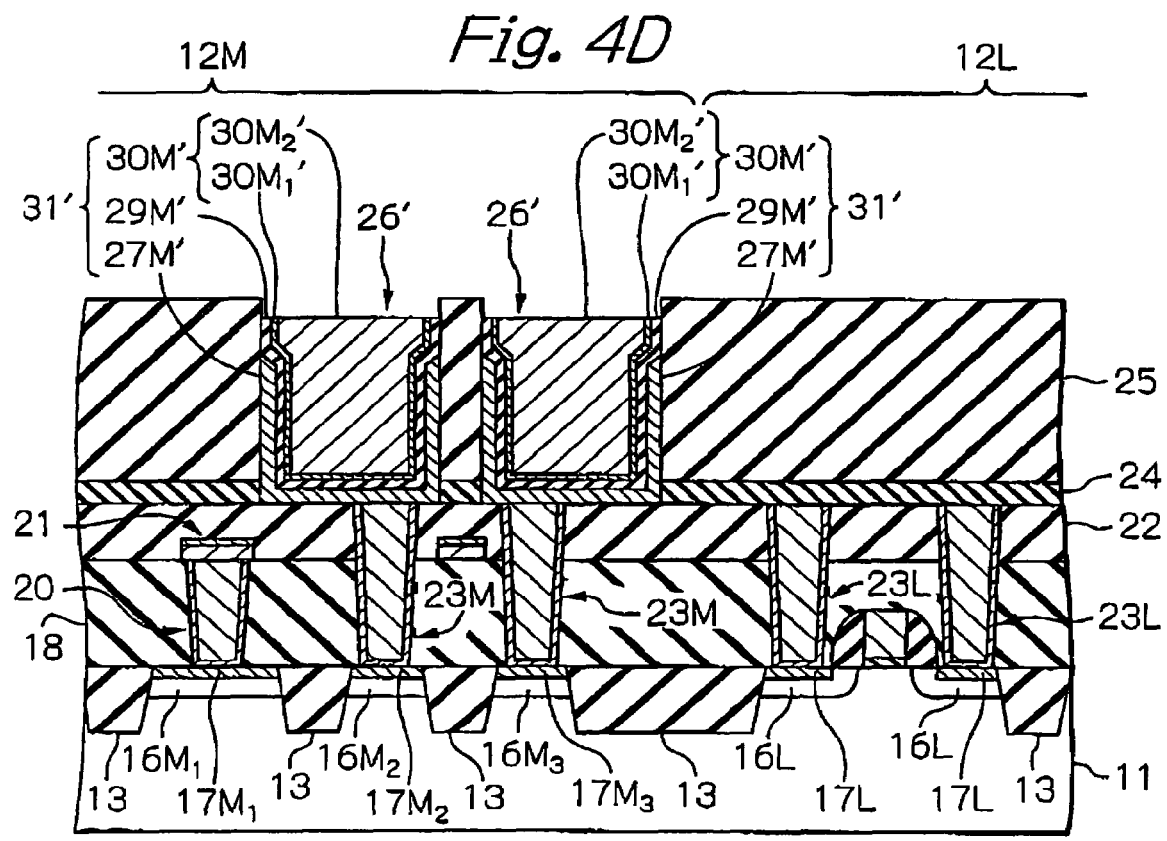

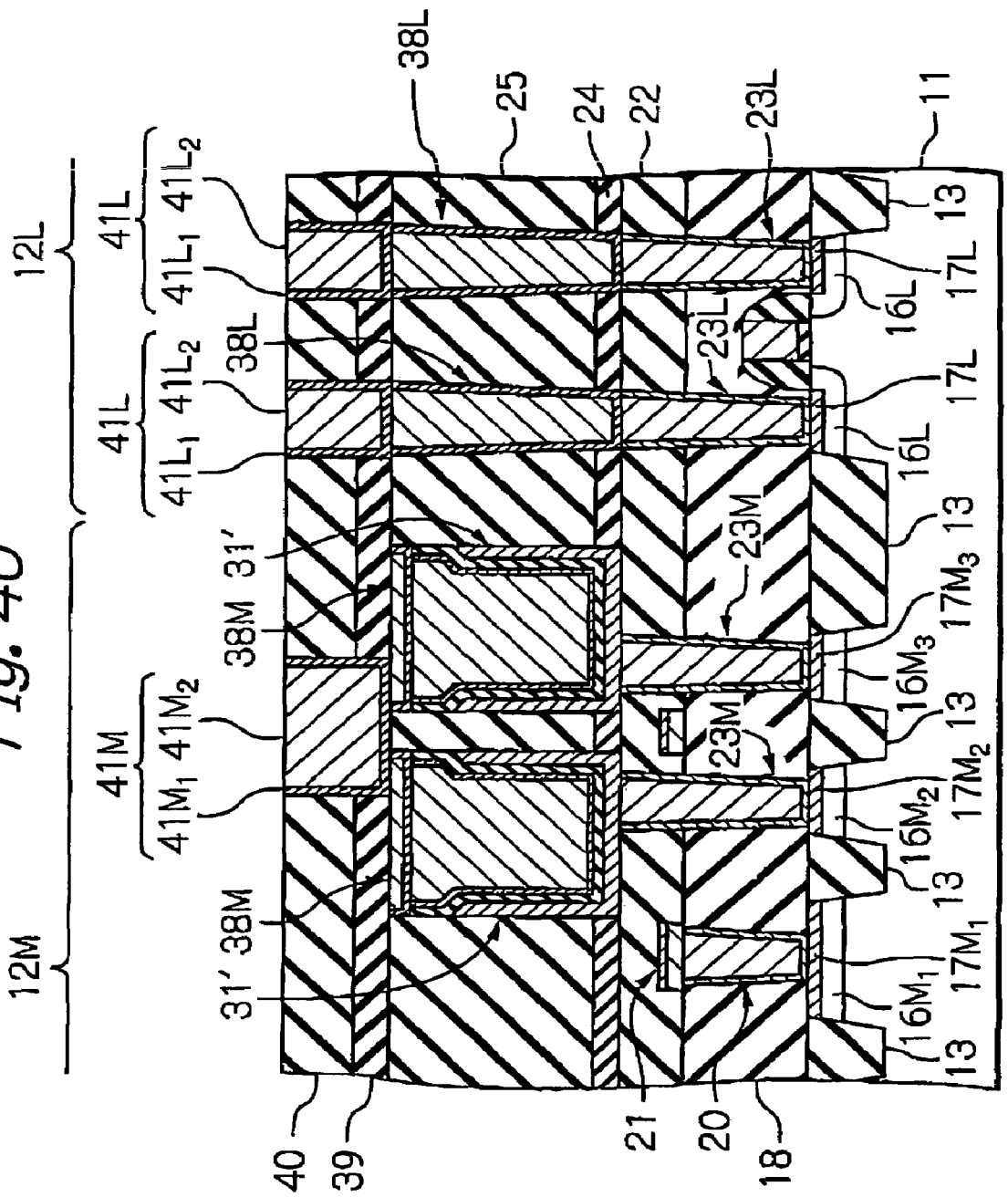

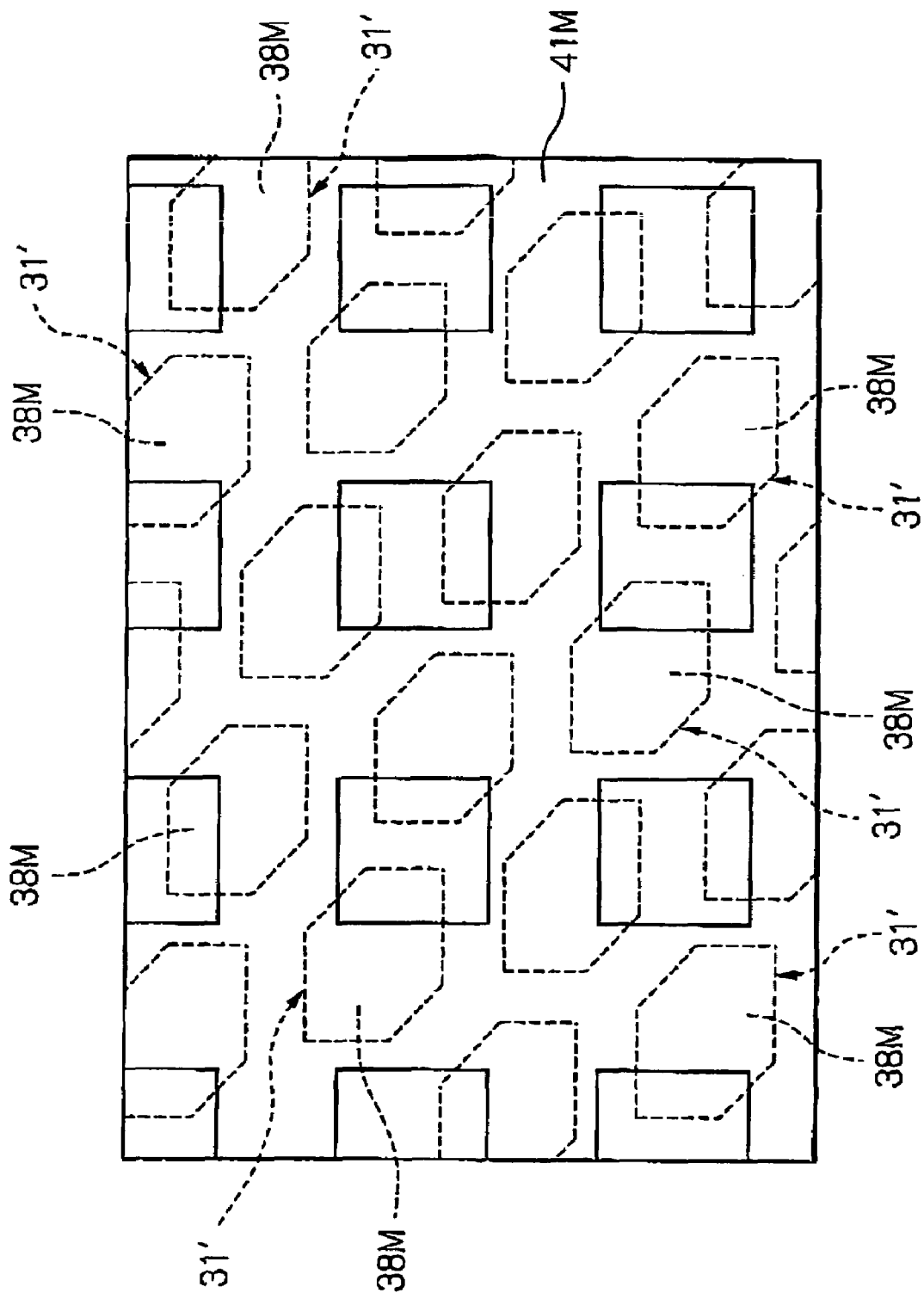

SEMICONDUCTOR DEVICE FEATURING COMMON CAPACITOR ELECTRODE LAYER, AND METHOD FOR MANUFACTURING SUCH SEMICONDUCTOR DEVICE

BACKGROUND OF THE INVENTION

1. Field of the Invention

The present invention relates to a semiconductor device including a logic-circuit formation section in which a plurality of logic circuits are formed, and a memory formation section in which a plurality of memory cells are formed, and relates to a method for manufacturing such a semiconductor device.

2. Description of the Related Art

For example, as disclosed in JP-2004-235246 A and JP-2005-005337 A, a prior art semiconductor device, which is called a large scale integrated (LSI) circuit, may include a logic-circuit formation section in which a plurality of logic circuits are formed, and a memory formation section in which a plurality of memory cells are formed. When the semiconductor device needs a large capacity memory, such a memory is formed as a dynamic random access memory (DRAM) in the memory formation section because memory cells of the DRAM can be formed in the memory formation section in a relatively small area.

SUMMARY OF THE INVENTION

It has now been discovered that the above-mentioned prior art semiconductor device has a problem to be solved as mentioned hereinbelow.

In the prior art semiconductor device, both the logic-circuit formation section and the memory formation section are simultaneously constructed in a semiconductor substrate such as a silicon substrate by using a well-known variety of processes such as a photolithography process, an etching process, a chemical vapor deposition (CVD) process, a sputtering process, a chemical mechanical polishing (CMP) process and so on.

In this case, it is necessary to contrive an arrangement of the semiconductor device so that the construction of the logic-circuit formation section and the construction of the memory formation section cannot exert a negative influence on each other, and so that the constructions can be efficiently carried out, as will be discussed in detail hereinafter.

In accordance with a first aspect of the present invention, there is provided a semiconductor device including a semiconductor substrate which is sectioned into a logic-circuit formation section in which a plurality of logic circuits are formed, and a memory formation section in which a plurality of memory cells are formed. A multi-layered insulating layer is formed on the semiconductor substrate, and a conductive structure is formed in the multi-layered insulating layer at the logic-circuit formation section. A plurality of capacitors are formed in the multi-layered insulating layer at the memory formation section, and each of the capacitors includes a lower capacitor electrode, a capacitor dielectric layer formed on the lower capacitor electrode, and an upper capacitor electrode formed on the capacitor dielectric layer, with upper faces of the upper capacitor electrodes being coplanar with an upper face of the conductive structure. A plurality of lower-side connection layers are formed in the multi-layered insulating layer below the lower capacitor electrodes of the capacitors at the memory formation section, and a logic-circuit-side connection layer is formed in the multi-layered insulating layer on or above the conductive structure at the logic-circuit formation section so as to be electrically connected to the conductive structure. An upper-side connection layer is formed in the multi-layered insulating layer at the memory formation section on or above the capacitors so as to be electrically connected to the upper capacitor electrodes of the capacitors.

An uppermost portion of each of the upper capacitor electrodes may be formed as a capacitor conductive plug, with which an upper face of the corresponding capacitor dielectric layer is covered.

The conductive structure may be formed as a contact structure. In this case, a height of the contact structure is equivalent to the height of the capacitors.

Also, the conductive structure may include a first signal-line layer having a via plug formed thereon, and a is second signal-line layer positioned above the first signal-line layer and electrically connected to the via plug.

In this case, a total height of the first and second signal-line layer and the via plug is equivalent to the height of the capacitors. Each of the lower-side connection layers may be formed as a bit-line layer.

The logic-circuit-side connection layer may be formed as a signal-line layer, and the upper-side connection layer may be formed as a common capacitor electrode layer. In this case, the common capacitor electrode layer may be directly and electrically connected to the upper capacitor electrodes of the capacitors. In this case, preferably, the common capacitor electrode layer has a lattice-like configuration, and the capacitors are regularly arranged so that an electrical connection is established between the common capacitor electrode layer and the upper capacitor electrodes of the capacitors.

The common capacitor electrode layer may have a plurality of via plugs formed on a lower face thereof. In this case, the common capacitor electrode layer is electrically connected to the upper capacitor electrodes of the capacitors through the intermediary of the respective via plugs. In this case, the common capacitor electrode layer may have a lattice-like configuration, and the capacitors are regularly arranged so that an electrical connection is established between the common capacitor electrode layer and the upper capacitor electrodes of the capacitors.

In accordance with a second aspect of the present invention, there is provided a method for manufacturing a semiconductor device, comprising: preparing a semiconductor substrate which is sectioned into a logic-circuit formation section in which a plurality of logic circuits are formed, and a memory formation section in which a plurality of memory cells are formed; forming a first insulating interlayer on the semiconductor substrate; forming a plurality of lower-side connection layers on the first insulating interlayer at the memory formation section; forming a second insulating interlayer on the first insulating interlayer so that the lower-side connection layers are covered with the second insulating interlayer; forming a first insulating layer on the second insulating interlayer; forming a plurality of openings in the first insulating layer; forming a first conductive layer on the first insulating layer so that inner wall surfaces of the openings are traversed by the first conductive layer; etching back the first conductive layer to thereby define a lower capacitor electrode, derived from the first conductive layer, in each of the openings, so that an upper edge of the lower capacitor electrode is positioned at a predetermined depth measured from an upper peripheral edge of the corresponding opening; forming a dielectric layer on the first insulating layer so that the inner wall surfaces of the openings are traversed by the capacitor dielectric layer; forming a second conductive layer on the capacitor dielectric layer so that the openings are filled with the second conductive layer; removing redundant materials of both the second conductive layer and the dielectric layer from the first insulating layer by using a chemical mechanical polishing (CMP) process to thereby define a capacitor dielectric layer and an upper capacitor electrode on the lower capacitor electrode in each of the openings, resulting in a formation of a capacitor in the corresponding opening; forming a logic-circuit-side conductive structure in the first insulating layer at the logic-circuit formation section so that upper faces of the upper capacitor electrodes are coplanar with an upper face of the logic-circuit-side conductive structure; forming a second insulating layer on the first insulating layer; and simultaneously forming a logic-circuit-side connection layer and an upper-side connection layer in the second insulating layer at the logic-circuit formation section and the memory formation section, respectively, so that the logic-circuit-side connection layer is electrically connected to the conductive structure, and so that the upper-side connection layer is electrically connected to the upper capacitor electrodes of the capacitors.

In accordance with a third aspect of the present invention, there is provided a method for manufacturing a semiconductor device, comprising: preparing a semiconductor substrate which is sectioned into a logic-circuit formation section in which a plurality of logic circuits are formed, and a memory formation section in which a plurality of memory cells are formed; forming a first insulating interlayer on the semiconductor substrate; forming a plurality of lower-side connection layers on the first insulating interlayer at the memory formation section; forming a second insulating interlayer on the first insulating interlayer so that the lower-side connection layers are covered with the second insulating interlayer; forming a first insulating layer on the second insulating interlayer; forming a plurality of openings in the first insulating layer; forming a first conductive layer on the first insulating layer so that inner wall surfaces of the openings are traversed by the first conductive layer; etching back the first conductive layer to thereby define a lower capacitor electrode, derived from the first conductive layer, in each of the openings, so that an upper edge of the lower capacitor electrode is positioned at a predetermined depth measured from an upper peripheral edge of the corresponding opening; forming a capacitor dielectric layer is on the first insulating layer so that the inner wall surfaces of the openings are traversed by the capacitor dielectric layer; forming a second conductive layer on the capacitor dielectric layer so that the openings are filled with the second conductive layer; etching back both the second conductive layer and the insulating layer so that redundant materials of both the second conductive layer and the insulating layer are removed from the first insulating layer, and so that respective recesses are defined at locations of the openings, to thereby define a capacitor dielectric layer and an upper capacitor electrode on the lower capacitor electrode in each of the openings, resulting in a formation of a capacitor in the corresponding opening; forming a logic-circuit-side conductive structure in the first insulating layer at the logic-circuit formation section, simultaneously forming capacitor conductive plugs in the recesses, so that upper faces of the capacitor conductive plugs are coplanar with an upper face of the logic-circuit-side conductive structure; forming a second insulating layer on the first insulating layer; and simultaneously forming a logic-circuit-side connection layer and an upper-side connection layer in the second insulating layer at the logic-circuit formation section and the memory formation section, respectively, so that the logic-circuit-side connection layer is electrically connected to the conductive structure, and so that the upper-side connection layer is electrically connected to the capacitor conductive plugs.

BRIEF DESCRIPTION OF THE DRAWINGS

The present invention will be more clearly understood from the description set forth below, as compared with the prior art semiconductor device, with reference to the accompanying drawings, wherein:

FIGS. 4A to 4G are cross-sectional views for explaining a second embodiment of the method for manufacturing a semiconductor device including a logic-circuit formation section and a memory formation section according to the present invention;

FIG. 5 is a plan view showing a part of the memory formation section of the semiconductor device of FIG. 4G;

DESCRIPTION OF THE PREFERRED EMBODIMENTS

Before description of embodiments of the present invention, for better understanding of the present invention, with reference to FIG. 1, a prior art semiconductor device will be explained below.

Figure 1:
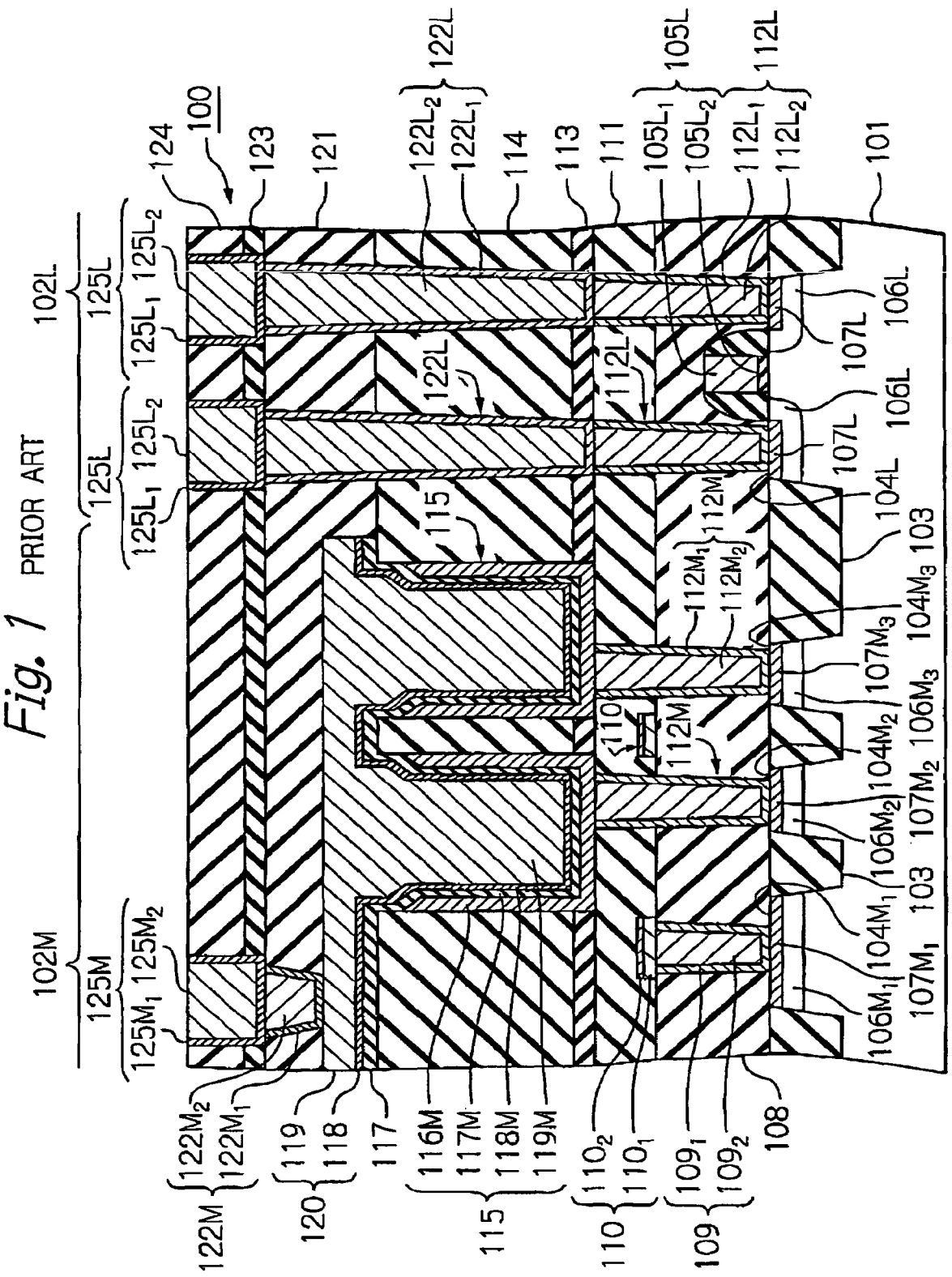
FIG. 1 is a cross-sectional view of a prior art semiconductor device including a logic-circuit formation section and a memory formation section.

Referring to FIG. 1 which is a cross-sectional view of a prior art semiconductor device, as disclosed in, for example, JP-2004-356520 A, the prior art semiconductor device is generally indicated by reference numeral 100, and includes a p-type silicon substrate 101 which is derived from a monocrystalline silicon wafer.

The silicon substrate 101 is sectioned into a logic-circuit formation section 102L in which a plurality of logic circuits are formed, and a memory formation section 102M in which a plurality of DRAM cells are formed.

A plurality of element-isolation layers 103 are formed in the silicon substrate 101 by using a shallow-trench isolation (STI) process, so that a plurality of transistor formation areas are defined on the surface of the silicon substrate 101. In the logic-circuit formation section 102L, only one of the defined transistor formation areas is representatively indicated by reference 104L. Also, in the memory formation section 102M, only three of the defined transistor formation areas are representatively indicated by references $104M_1$, $104M_2$ and $104M_3$, respectively.

An n-channel type MOS transistor is formed as a logic transistor in the transistor formation area 104L, and includes a gate structure 105L formed on the transistor formation area 104L, and a pair of source/drain regions 106L formed in the transistor formation area 104L. The gate structure 105L includes a gate insulating layer $105L_1$, formed on the transistor formation area 104L, and a gate electrode 105L$_2$ formed on the gate insulating layer 105L$_1$.

On the other hand, three n-channel type MOS transistors are respectively formed as DRAM transistors in the transistor formation areas 104M$_1$, 104M$_2$ and 104M$_3$, and each of the DRAM transistors includes a gate structure (not shown) formed on the corresponding transistor formation area 104M$_1$, 104M$_2$ or 104M$_3$, and a pair of source/drain regions 106M$_1$, 106M$_2$ or 106M$_3$ formed in the corresponding transistor formation area 104M$_1$, 104M$_2$ or 104M$_3$. Similar to the gate structure 105L, the gate structure (not shown) includes a gate insulating layer on the corresponding transistor formation area 104M$_1$, 104M$_2$ or 104M$_3$, and a gate electrode formed on the gate insulating layer.

Note, in FIG. 1, only one of the source/drain regions 106M$_1$, 106M$_2$ or 106M$_3$ in each pair is illustrated.

Suitable silicide layers 107L are formed as interconnect layers on the surface of the silicon substrate 101 at the logic-circuit formation section 102L so as to be electrically connected to the respective source/drain regions 106L.

On the other hand, suitable silicide layers 107M$_1$, 107M$_2$ and 107M$_3$ are formed as interconnect layers on the surface of the silicon substrate 101 at the memory formation section 102M so as to be electrically connected to the respective source/drain regions 106M$_1$, 106M$_2$ and 106M$_3$.

Note, the formation of the silicide layers 107L and the formation of the silicide layers 107M$_1$, 107M$_2$ and 107M$_3$ may be simultaneously carried-out by using a so-called salicide process.

A silicon dioxide layer 108 is formed as an insulating interlayer on the surface of the silicon substrate 101, so that the gate structures 105L and the silicide layers or interconnect layers 107L, 107M$_1$, 107M$_2$ and 107M$_3$ are covered with the insulating interlayer 108.

A bit-line contact structure 109 is formed in the insulating interlayer 108 by using a photolithography and etching process, a CVD process and so on, so as to be electrically connected to the interconnect layer 107M$_1$. For example, the bit-line contact structure 109 includes a titanium nitride layer 109$_1$ exhibiting a superior adhesive property to the insulating interlayer or silicon dioxide layer 108, and a tungsten plug 109$_2$ exhibiting a superior adhesive property to the titanium nitride layer 109$_1$. Note, although the tungsten plug 109$_2$ exhibits an inferior adhesive property to the silicon dioxide layer 108, the bit-line contact structure 109 can be securely adhered to the silicon dioxide layer 108 due to the existence of the titanium nitride layer 109$_1$.

Connection layers or bit-line layers 110 are formed on the insulating interlayer 108 at the memory formation section 102M by using a photolithography and etching process, a CVD process and so on, with one of the illustrated bit-line layers 110 being electrically connected to the bit-line contact structure 109. Each of the bit-line layers 110 includes a tungsten layer 110$_1$ formed on the insulating interlayer 108, and a titanium nitride layer 110$_2$ formed on the tungsten layer 110$_1$.

A silicon dioxide layer 111 is formed as an insulating interlayer on the insulating interlayer 108 by using a CVD process, a CMP process and so on, so that the bit-line layers 110 are covered with the insulating interlayer 111. Note that each of the bit-line layers 110 can be securely adhered to the insulating interlayer 111 due to the titanium nitride layer 110$_2$ of the bit-line layers 110.

Logic-circuit-side contact structures 112L are formed in both the insulating interlayers 108 and 111 at the logic-circuit formation section 102L so as to be electrically connected to the respective interconnect layers 107L. For the same reason as in the formation of the bit-line contact structure 109, each of the logic-circuit-side contact structures 112L includes a titanium nitride layer 112L$_1$ and a tungsten plug 112L$_2$.

On the other hand, memory-side contact structures 112M are formed in both the insulating interlayers 108 and 111 at the memory formation section 102M so as to be electrically connected to the respective interconnect layers 107M$_2$ and 107M$_3$. Each of the memory-side contact structures 112M also includes a titanium nitride layer 112M$_1$ and a tungsten plug 112M$_2$.

Note, the formation of the logic-circuit-side contact structures 112L and the formation of the memory-side contact structures 112M may be simultaneously carried out by using a photolithography and etching process, a CVD process and so on.

A silicon nitride layer 113 and a silicon dioxide layer 114 are formed in order as insulating interlayers on the insulating interlayer 111 by using a CVD process, a CMP process and so on. Then, a plurality of capacitors 115 are formed in both the insulating interlayers 113 and 114 at the memory formation section 102M by using a well-known variety of processes such as a photolithography process, an etching process, a CVD process, a CMP process and so on. Note, in FIG. 1, only two of the capacitors 115 are illustrated by way of example.

In particular, for example, each of the capacitors 115 includes a titanium nitride layer 116M formed on an inner wall surface of an opening defined in both the insulating interlayers 113 and 114, a tantalum oxide layer 117M formed on the titanium nitride layer 116M, a titanium nitride layer 118M formed on the tantalum oxide layer 117M, and a tungsten layer 119M formed on the titanium nitride layer, with the aforesaid opening being filled with the tungsten layer 119M. Namely, the titanium nitride layer 116M serves as a lower capacitor electrode of the capacitor 115 concerned, and the tantalum oxide layer 117M serves as a capacitor dielectric layer of the capacitor 115 concerned. Also, both the titanium nitride layer 118M and the tungsten layer 119M serve as an upper capacitor electrode of the capacitor 115 concerned, As shown in FIG. 1, the tantalum oxide layer 117M is defined as a part of a tantalum oxide layer 117 formed on the insulating interlayer 114 at the memory formation section 102M. Similarly, the titanium nitride layer 118M is defined as a part of a titanium nitride layer 118 formed on the tantalum oxide layer 117, and the tungsten layer 119M is defined as a part of a tungsten layer 119 formed on the titanium nitride layer 118, whereby both the titanium nitride layer 118 and the tungsten layer 119 form a common capacitor plate 120 to all the capacitors 115. Note that the common capacitor plate 120 may be formed by using a photolithography and etching process, an etching process and so on.

A silicon dioxide layer 121 is formed as an insulating interlayer on the insulating interlayer 114 by using a CVD process and a CMP process, so that the common capacitor plate 120 is covered with the insulating interlayer 121.

Logic-circuit-side contact structures 122L are formed in both the insulating interlayers 114 and 121 at the logic-circuit formation section 102L so as to be electrically connected to the respective logic-circuit-side contact structures 112L. For the same reason as in the formation of the bit-line contact structure 109, each of the logic contact structures 122L includes a titanium nitride layer 122L$_1$ and a tungsten plug 122L$_2$.

On the other hand, a memory-side contact structure 122M is formed in the insulating interlayer 121 at the memory formation section 102M so as to be electrically connected to the tungsten layer 119 of the common capacitor plate 120. The memory-side contact structure 122M also includes a titanium nitride layer 122M$_1$ and a tungsten plug 122M$_2$.

A silicon nitride layer 123 and a silicon dioxide layer 124 are formed in order as insulating interlayers on the insulating interlayer 121 by using a CVD process and a CMP process. Signal-line layers 125L are formed in both the insulating interlayers 123 and 124 so as to be electrically connected to the respective logic-circuit-side contact structures 122L, and each of the signal-line layers 125L includes a titanium nitride layer $125L_1$ and a tungsten layer $125L_2$ for the same reason as in the formation of the bit-line contact structure 109. On the other hand, a memory-side connection layer 125M, which also includes a titanium nitride layer $125M_1$ and a tungsten layer $125M_2$, is formed in both the insulating interlayers 123 and 124 so as to be electrically connected to the memory-side contact structure 122M.

Note that the formation of the signal-line layer 125L and the formation of the memory-side connection layer 125M may be simultaneously carried out by using a photolithography and etching process, a CVD process, a CMP process and so on.

Optionally, in each of the signal-line layers 125L, both a tantalum nitride layer and a tantalum layer may be substituted for the titanium nitride layer $125L_1$, and a copper layer may be substituted for the tungsten layers $125L_2$. Both the tantalum nitride layer and the tantalum layer serve as a barrier metal layer 125L, for preventing diffusion of copper atoms from the corresponding copper layer $125L_2$ into the insulating interlayers 123 and 124. Note that the same is true for the memory-side connection layer 125M.

In the semiconductor device of FIG. 1, the formation of the common capacitor plate 120 is carried out by using the photolithography and etching process, the etching process and so on, but these processes are unrelated to the construction of the logic-circuit formation section 102L. Namely, the processes do not contribute to the construction of the logic-circuit formation section 102L. In this regard, the manufacture of the semiconductor device of FIG. 1 is inefficient.

Also, in the semiconductor device of FIG. 1, an aspect ratio of the logic-circuit-side contact structures 122L is increased due to the existence of both the common capacitor plate 120 and the memory-side capacitor contact structure 122M. Namely, the logic-circuit-side contact structures 122L have an additional height corresponding to a thickness of both the common capacitor plate 120 and the memory-side contact structure 122M. When the logic-circuit-side contact structures 122L have a high aspect ratio, a defect is liable to occur in the formation of the logic-circuit-side contact structures 122L, resulting in reduction in a manufacturing yield of the semiconductor devices. Also, when the logic-circuit-side contact structures 122L have a high aspect ratio, an operation speed may decline at the logic-circuit section 12L.

In the semiconductor device of FIG. 1, the aspect ratio of the logic contact structures 122L can be made smaller by lowering the height of the capacitors 115. Nevertheless, this should not be adopted in that the capacitance of the capacitors 115 becomes smaller, and thus a time period for refreshing the DRAM is shortened, resulting in a large power consumption for driving the DRAM.

First Embodiment

Figure 2A:
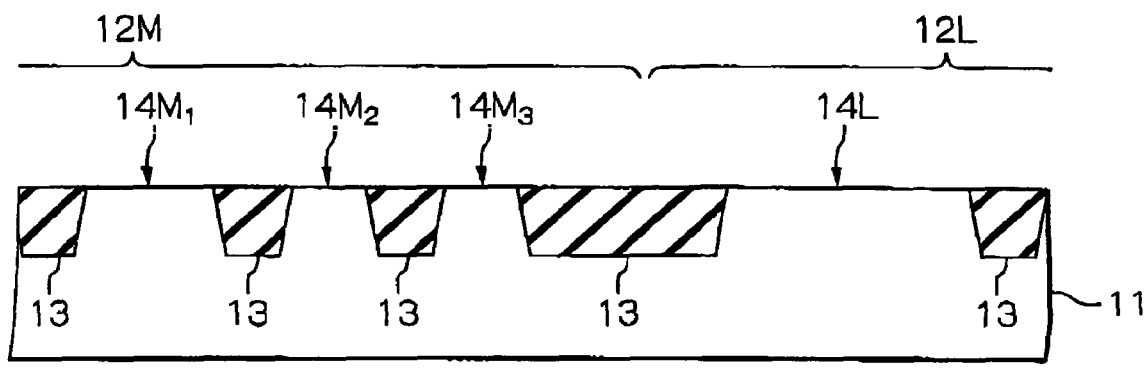
FIGS. 2A to 2P are cross-sectional views for explaining a first embodiment of the method for manufacturing a semiconductor device including a logic-circuit formation section and a memory formation section according to the present invention.
Figure 2B:
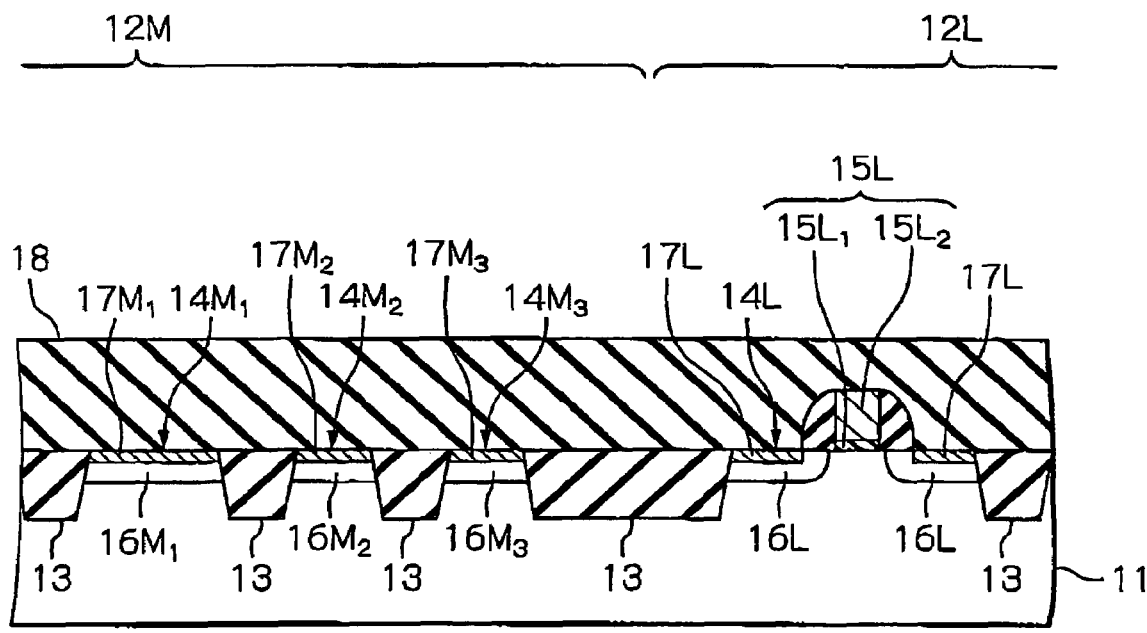
Figure 2K:
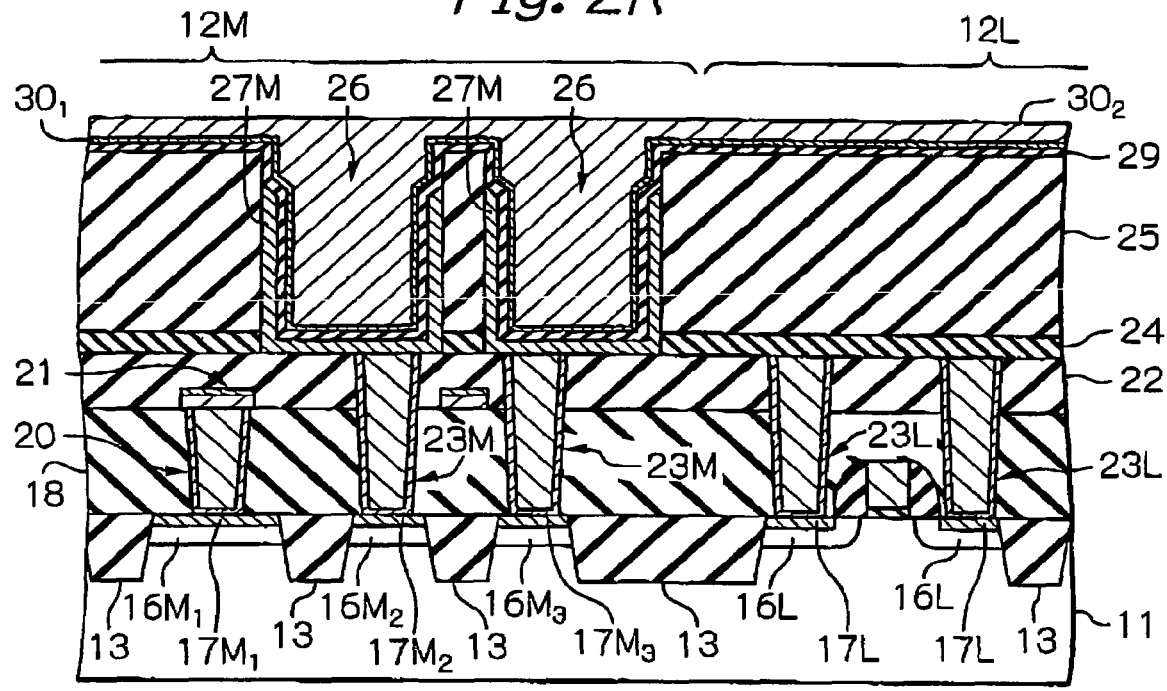
Figure 2L:
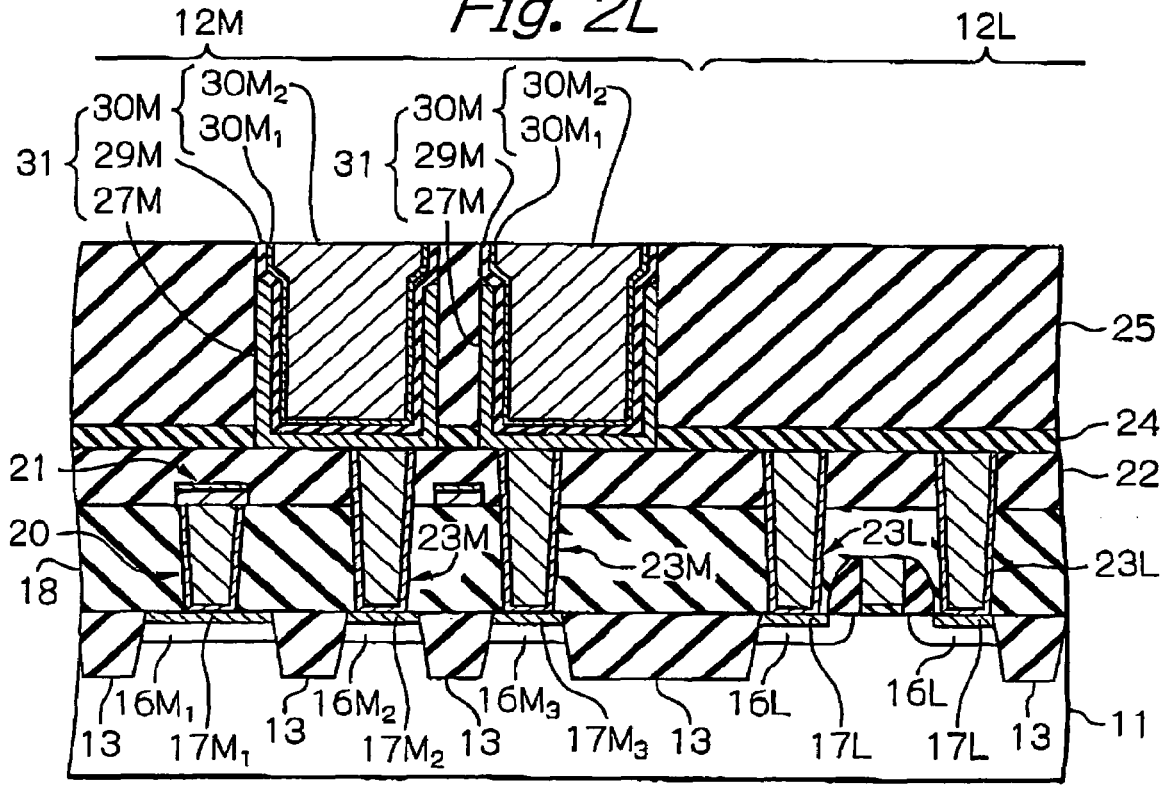
Figure 20:
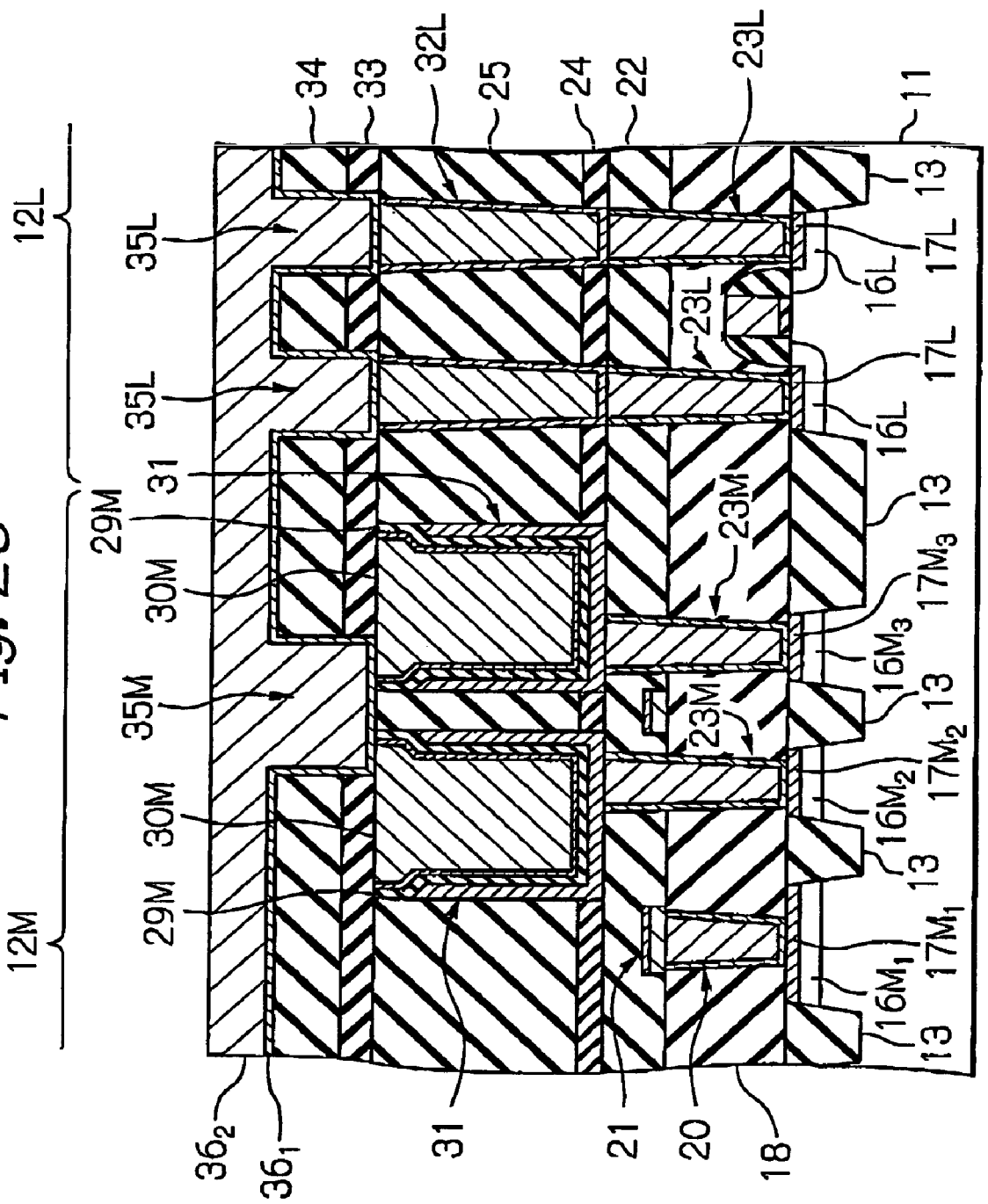
Figure 2P:
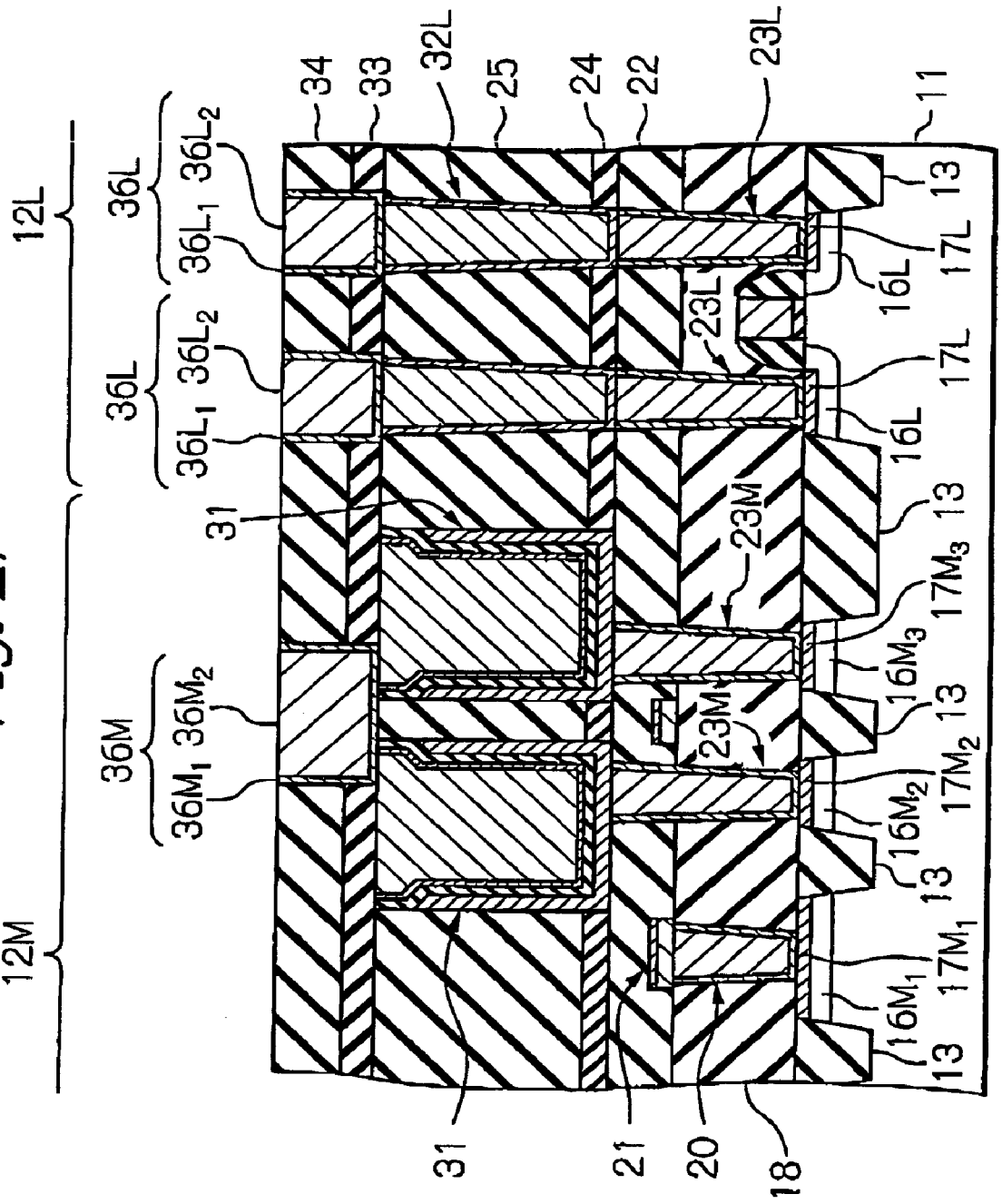

With reference to FIGS. 2A to 2P which are partial cross-sectional views, a first embodiment of the method manufacturing a semiconductor device according to the present invention is explained below.

First, as shown in FIG. 2A, a p-type silicon substrate 11, which may be derived from a monocrystalline silicon wafer, is prepared. The silicon substrate 11 is sectioned into a logic-circuit formation section 12L in which a plurality of logic circuits should be formed, and a memory formation section 12M in which a plurality of DRAM cells should be formed.

Then, a plurality of element-isolation layers 13 are formed in the silicon substrate 11 by using an STI process, so that a plurality of transistor formation areas are defined on the surface of the silicon substrate 11. In the logic-circuit formation section 12L, only one of the defined transistor formation areas is representatively indicated by reference 14L, and, in the memory formation section 12M, only three of the defined transistor formation areas are representatively indicated by reference $14M_1$, $14M_2$ and $14M_3$, respectively.

Next, as shown in FIG. 2B, an n-channel type MOS transistor is formed as a logic transistor in the transistor formation area 14L, and includes a gate structure 15L formed on the transistor formation area 14L, and a pair of source/drain regions 16L formed in the transistor formation area 14L. The gate structure 15L includes a gate insulating layer $15L_1$ formed on the transistor formation area 14L, and a gate electrode $15L_2$ formed on the gate insulating layer $15L_1$.

On the other hand, three n-channel type MOS transistors are respectively formed as DRAM transistors in the transistor formation areas $14M_1$, $14M_2$ and $14M_3$, and each of the DRAM transistors includes a gate structure (not shown) formed on the corresponding transistor formation area $14M_1$, $14M_2$ or $14M_3$, and a pair of source/drain regions $16M_1$, $16M_2$ or $16M_3$ formed in the corresponding transistor formation area $14M_1$, $14M_2$ or $14M_3$. Similar to the gate structure 15L, the gate structure (not shown) includes a gate insulating layer on the corresponding transistor formation area $104M_1$, $104M_2$ or $104M_3$, and a gate electrode formed on the gate insulating layer.

Note, in FIG. 2B, only one of the source/drain regions $16M_1$, $16M_2$ or $16M_3$ in each pair is illustrated.

The formation of the logic transistors in the logic-circuit formation section 12L and the formation of the DRAM transistors in the memory formation section 12M are simultaneously carried out by using a well-known variety of processes such as a photolithography process, an etching process, a CVD process, a sputtering process and so on.

After the formation of the logic and DRAM transistors is completed, suitable silicide layers 17L are formed as interconnect layers on the surface of the silicon substrate 11 at the logic-circuit formation section 12L so as to be electrically connected to the source/drain regions 16L, respectively.

Simultaneously, suitable silicide layers $17M_1$, $17M_2$ and $17M_3$ are formed as interconnect layers on the surface of the silicon substrate 11 at the memory formation section 12M so as to be electrically connected to the source/drain regions $16M_1$, $16M_2$ and $16M_3$, respectively.

Note that the formation of the silicide layers 17L, $17M_1$, $17M_2$ and $17M_3$ may be carried out by a so-called salicide process.

Then, a silicon dioxide layer 18 is formed as an insulating interlayer on the surface of the silicon substrate 11 by using a CVD process, and a surface of the silicon dioxide layer or insulating interlayer 18 is flattened by using a CMP process, so that the gate structures 15L and the silicide layers or interconnect layers 17L, $17M_1$, $17M_2$ and $17M_3$ are covered with the insulating interlayer 18.

Next, as shown in FIG. 2C, a hole 19 for forming a bit-line contact structure is perforated in the insulating interlayer 18 by using a photolithography and etching process, so that a part of the silicide layer or interconnect layer $17M_1$ is exposed with the hole 19. Then, a titanium nitride layer $20_1$ is formed on the surface of the insulating interlayer 18 so that an inner wall surface of the hole 19 is traversed by the titanium nitride layer $20_1$, and then a tungsten layer $20_2$ is formed on the titanium nitride layer $20_1$ so that the hole 19 is filled with tungsten. Note that the formation of the titanium nitride layer $20_1$ and the formation of the tungsten layer $20_2$ may be continuously carried out by using a CVD process or a sputtering process.

Next, as shown in FIG. 2D, both the tungsten layer $20_2$ and the titanium nitride layer $20_1$ (see: FIG. 2C) are subjected to a CMP process in which the redundant materials of the tungsten and titanium nitride layers $20_2$ and $20_1$ are removed from the surface of the insulating interlayer 18, so that a bit-line contact structure 20 is formed in the hole 19 (see: FIG. 2C) so as to be electrically connected to the interconnect layer $17M_1$.

Namely, the bit-line contact structure 20 is made of a titanium nitride layer $20_1'$ derived from the titanium nitride layer $20_1$ (see: FIG. 2C), and a tungsten plug $20_2'$ derived from the tungsten layer $20_2$ (see: FIG. 2C). Although the tungsten plug $20_2'$ itself exhibits an inferior adhesive property to the silicon dioxide layer or insulating interlayer 18, the titanium nitride layer $20_1'$ exhibits a superior adhesive property to both the insulating interlayer 18 and the tungsten plug $20_2'$, and thus it possible to ensure a secure adhesion of the bit-line contact structure 20 itself to the insulating interlayer 18.

After the formation of the bit-line contact structure 20 is completed, a tungsten layer $22_1$ and a titanium nitride layer $22_2$ are formed in order on the insulating interlayer 18 by using a CVD process or a sputtering process.

Next, as shown in FIG. 2E, both the tungsten layer $22_1$ and the titanium nitride layer $22_2$ (see: FIG. 2D) are patterned by using a photolithography and etching process, so that connection layers or bit-line layers 21 are formed on the insulating interlayer 18 at the memory formation section 12L, with one of the illustrated bit-line layers 21 being electrically connected to the bit-line contact structure 20. Namely, each of the bit-line layers 21 includes a tungsten layer $21_1'$ derived from the tungsten layer $22_1$, and a titanium nitride layer $21_2'$ derived from the titanium nitride layer $22_2$.

Next, as shown in FIG. 2F, a silicon dioxide layer 22 is formed as an insulating interlayer on the insulating interlayer 18 by using a CVD process so that the bit-line layers 21 are covered with the insulating interlayer 22, and a surface of the silicon dioxide layer or insulating interlayer 22 is flattened by using a CMP process. Note that each of the bit-line layers 21 can be securely adhered to the insulating interlayer 22 due to the titanium nitride layer $21_2'$.

Then, logic-circuit-side contact structures 23L are formed in both the insulating interlayers 18 and 22 at the logic-circuit formation section 12L, and memory-side contact structures 23M are formed in both the insulating interlayers 18 and 22 at the memory formation section 12M. Both the formation of the logic-circuit-side contact structures 23L and the formation of the memory-side contact structures 23M may be carried out in a similar manner to that in the formation of the bit-line contact structure 20 in the insulating interlayer 18. In short, each of the logic-circuit-side and memory-side contact structures 23L and 23M includes a titanium nitride layer $23_1'$ formed on an inner wall surface of a hole perforated in both the insulating interlayers 18 and 22, and a tungsten plug $23_2'$ formed on the titanium nitride layer $23_1'$ so that the hole is filled with tungsten.

Note that the logic-circuit-side contact structures 23L are electrically connected to the respective logic-circuit-side interconnect layers 17L. Also, note that the memory-side contact structures 23M are electrically connected to the respective capacitor interconnect layers $17M_2$ and $17M_3$.

Next, as shown in FIG. 2G, a silicon nitride layer 24 and a silicon dioxide layer 25 are formed in order as insulating interlayers on the insulating interlayer 22 by using a CVD process and a CMP process. Then, openings 26 for forming capacitors are defined in both the insulating interlayers 24 and 25 at the memory formation section 12M by using a photolithography and etching process, so that upper faces of the memory-side contact structures 23M are exposed with the openings 26.

Next, as shown in FIG. 2H, a titanium nitride layer 27 is formed on the insulating interlayer 25 by using a CVD process or a sputtering process, so that the inner wall surfaces of the openings 26 are traversed by the titanium nitride layer 27, with the titanium nitride layer 27 being electrically connected to the memory-side contact structures 23M. Then, a photoresist layer 28 is formed on the titanium nitride layer 27 so that the openings 26 are filled with the photoresist material.

Next, as shown in FIG. 2I, the photoresist layer 28 (see: FIG. 2H) is subjected to a photolithography process so that respective photoresist masks 28M are formed in the openings 26.

In particular, in the photolithography process, the photoresist layer 28 is exposed with ultraviolet rays so that the ultraviolet rays are penetrated into the portions of the photoresist layer 28, which are received in the respective openings 26, at a depth "d" of somewhat more than 100 nm measured from the upper peripheral edges of the openings 26. Then, the exposed photoresist layer 28 is developed, resulting in the formation of the photoresist masks 28M in the respective openings 26.

Next, as shown in FIG. 2J, the titanium nitride layer 27 is etched back by using a dry etching process or anisotropic etching process, so that a titanium nitride layer 27H is formed as a lower capacitor electrode in each of the openings 26. Note, an upper peripheral edge of each of the lower capacitor electrodes 27M is positioned at a level of approximately 100 nm measured from the upper peripheral opening edges of the openings 26. After the formation of the lower capacitor electrodes 27M is completed, the photoresist masks 28M are removed from the openings 26.

Next, as shown in FIG. 2K, a dielectric layer 29, which is composed of a high dielectric constant material such as tantalum oxide, is formed on the insulating interlayer 25 by using a CVD process so that the inner wall surfaces of the openings 26 are traversed by the dielectric layer or tantalum oxide layer 29. Then, a titanium nitride layer $30_1$ is formed on the tantalum oxide layer 29, and a tungsten layer $30_2$ is formed on the titanium nitride layer $30_1$ so that the openings 26 are filled with tungsten.

Next, as shown in FIG. 2L, the tungsten, titanium nitride and tantalum oxide layers $30_2$, $30_1$ and 29 (see: FIG. 2K) are subjected to a CMP process in which the redundant materials of the tungsten, titanium nitride and tantalum oxide layers $30_2$, $30_1$ and 29 are removed from the surface of the insulating interlayer 25, so that a tantalum oxide layer 29M, a titanium nitride layer $30M_1$ and a tungsten layer $30M_2$ are formed in each of the openings 26 (see: FIG. 2K). The tantalum oxide layer 29M serves as a capacitor dielectric layer, and both the titanium nitride layer 30M, and the tungsten layer $30M_2$ define an upper capacitor electrode 30M. In short, in each of the openings 26 (see: FIG. 2K), the lower capacitor electrode 27M, the capacitor dielectric layer 29M and the upper capacitor electrode 30M form a capacitor 31.

Note that each of the capacitors 31 features that the upper face of the capacitor dielectric layer 29H and the upper capacitor electrode 30M are coplanar with the surface of the insulating interlayer 25.

Next, as shown in FIG. 2M, logic-circuit-side contact structures 32L are formed in both the insulating interlayers 24 and 25 at the logic-circuit formation section 12L in a similar manner to that in the formation of the bit-line contact structure 20 in the insulating interlayer 18. In short, each of the logic-circuit-side contact structures 32L includes a titanium nitride layer $32_1'$ formed on an inner wall surface of a hole perforated in both the insulating interlayers 24 and 25, and a tungsten plug $32_2'$ formed on the titanium nitride layer $32_1'$ so that the hole is filled with tungsten.

Note that the formation of the logic-circuit-side contact structures 32L is carried out so that the respective logic-circuit-side contact structures 32L are electrically connected to the logic-circuit-side contact structures 23L formed in both the insulating interlayers 18 and 22.

Next, as shown in FIG. 2N, a silicon nitride layer 33 and a silicon dioxide layer 34 are formed in order as insulating interlayers on the insulating interlayer 25 by using a CVD process and a CMP process. Then, trenches 35L for forming signal-line layers and a trench 35M for forming a common capacitor electrode layer are formed in both the insulating interlayers 33 and 34 by using a photolithography and etching process.

Next, as shown in FIG. 2O, a titanium nitride layer $36_1$ is formed on the insulating interlayer 34 by using a CVD process or a sputtering process so that the inner wall surfaces of the trenches 35L and 35M are traversed by the titanium nitride layer $36_1$. Then, a tungsten layer $36_2$ is formed on the titanium nitride layer $36_1$ so that the trenches 34L and 34M are filled with tungsten.

Next, as shown in FIG. 2P, both the tungsten layer $36_2$ and the titanium nitride layer $36_1$ (see: FIG. 2O) are subjected to a CMP process in which the redundant materials of the tungsten and titanium nitride layers $36_2$ and $36_1$ are removed from the surface of the insulating interlayer 34, so that both a titanium nitride layer $36L_1$ and a tungsten layer $36L_2$ are left in each of the trenches 34L (see: FIG. 2O), and so that both a titanium nitride layer $36M_1$ and a tungsten layer $36M_2$ are left in the trench 34M (see; FIG. 2O), resulting in completion of production of the semiconductor device featuring the logic-circuit formation section 12L and the memory formation section 12M.

Note, in each of the trenches 34L (see: FIG. 2O), both the titanium nitride layer $36L_1$ and the tungsten layer $36L_2$ define a signal-line layer 36L electrically connected to the corresponding logic-circuit-side contact structures 32L. Also, note, in the trench 34M (see: FIG. 2O), both the titanium nitride layer $36M_1$ and the tungsten layer $36M_2$ defines a common capacitor electrode layer 36M electrically connected to the upper capacitor electrodes 30M of the capacitors 31.

In the semiconductor device of FIG. 2P, in each of the signal-line layers 36L, both a tantalum nitride layer and tantalum layer may be substituted for the titanium nitride layer $36L_1$, and a copper layer may be substituted for the tungsten layers $36L_2$. Both the tantalum nitride layer and the tantalum layer serve as a barrier metal layer $36L_1$ for preventing diffusion of copper atoms from the corresponding copper layer $36L_2$ into the insulating interlayers 33 and 34. Note that the same is true for the common capacitor electrode layer 36M.

Figure 3:
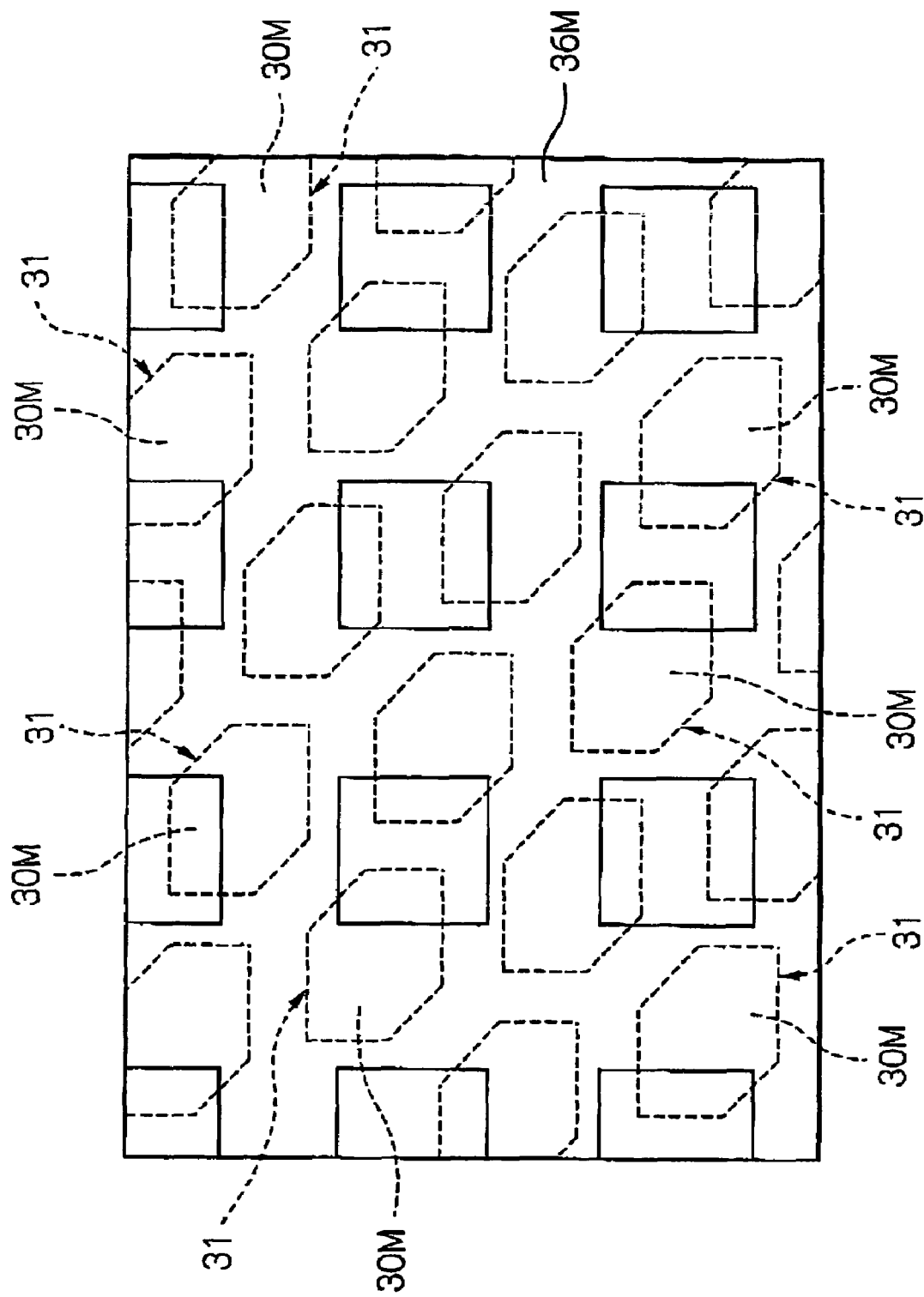
FIG. 3 is a plan view showing a part of the memory formation section of the semiconductor device of FIG. 2P.

As shown in FIG. 3 which is a partial plan view showing the memory formation section 12M of the semiconductor device of FIG. 2P, the common capacitor electrode layer 36M has a lattice-like configuration, and the capacitors 31 are regularly arranged so that an electrical connection is established between the common capacitor electrode layer 36M and the upper capacitor electrodes 30M of the capacitors 31.

With the arrangement of the semiconductor device of FIG. 2P, since the common capacitor electrode layer 36M is formed in both the insulating interlayers 33 and 34 in which the signal-line layers 36L are formed, it is possible to make an aspect ratio of the logic-circuit-side contact structures 32L considerably smaller in comparison with the logic-circuit-side contact structures 122L of FIG. 1.

For example, in the semiconductor device of FIG. 1, when the capacitors 112 have the height of 400 nm, the height of the common capacitor plate 120 is on the order of 100 nm, and the height of the capacitor contact structure 122M is on the order of 200 nm. Thus, the logic-circuit-side contact structures 122L may have the height of 700 nm.

On the other hand, in the semiconductor device of FIG. 2P, the logic contact structures 32L have substantially the same height as that of the capacitors 31. Accordingly, when the capacitors 31 has the height of 400 nm, the height of the logic contact structures 32L is also 400 nm.

Also, since the formation of the common capacitor electrode layer 36M and the formation of the signal-line layers 36L can be simultaneously carried out by using the photolithography and etching process, the CVD process or sputtering process, the CMP process and so on, it is possible to more efficiently manufacture the semiconductor device in comparison with the prior art semiconductor device of FIG. 1.

Second Embodiment

With reference to FIGS. 4A to 4G which are partial cross-sectional views, a second embodiment of the method for manufacturing a semiconductor device according to the present invention is explained below.

In the second embodiment, the same steps as those of FIG. 2A to FIG. 2H are executed.

Figure 4A:
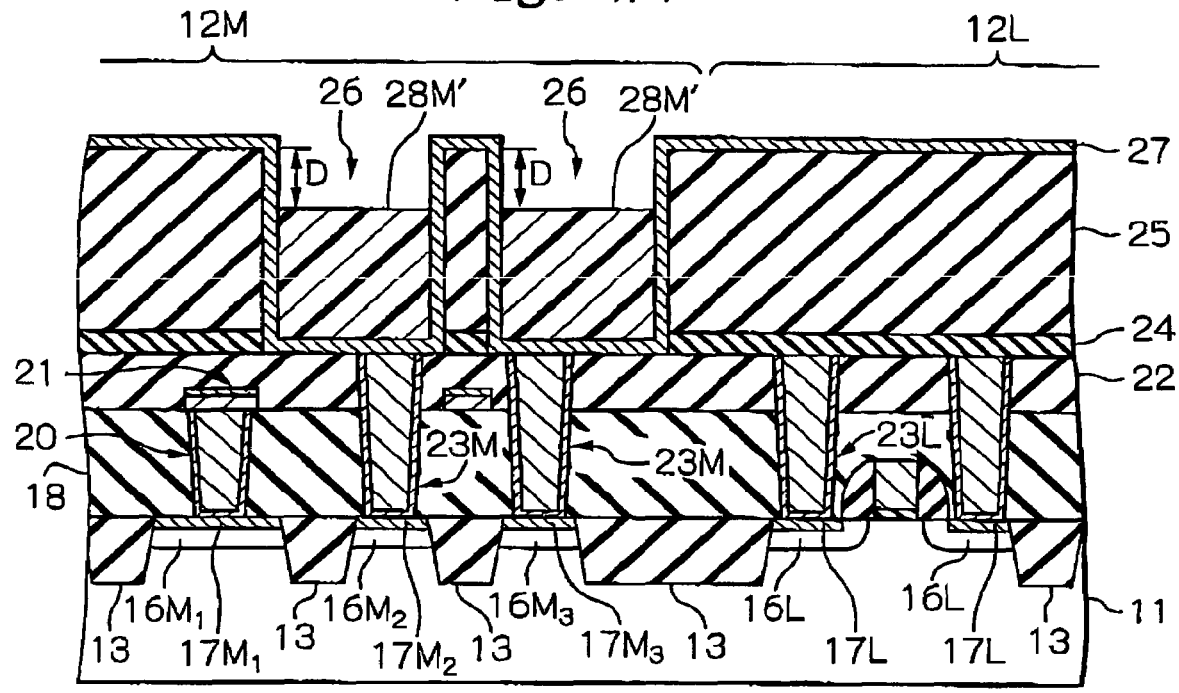

As shown in FIG. 4A which corresponds to FIG. 2I, the photoresist layer 28 (see: FIG. 2H) is subjected to a photolithography process so that respective photoresist masks 28M' are formed in the openings 26, with the photoresist masks 28M' having a smaller thickness than that of the photoresist masks 28M of FIG. 2I.

In particular, in the photolithography process, the photoresist layer 28 (see: FIG. 2H) is exposed with ultraviolet rays so that the ultraviolet rays are penetrated into the portions of the photoresist layer 28, which are received in the respective openings 26, at a somewhat deeper depth "D" than the depth "d" (see: FIG. 2I). Then, the exposed photoresist layer 28 (see: FIG. 2H) is developed, resulting in the formation of the photoresist masks 28M' in the respective openings 26.

Figure 4B:
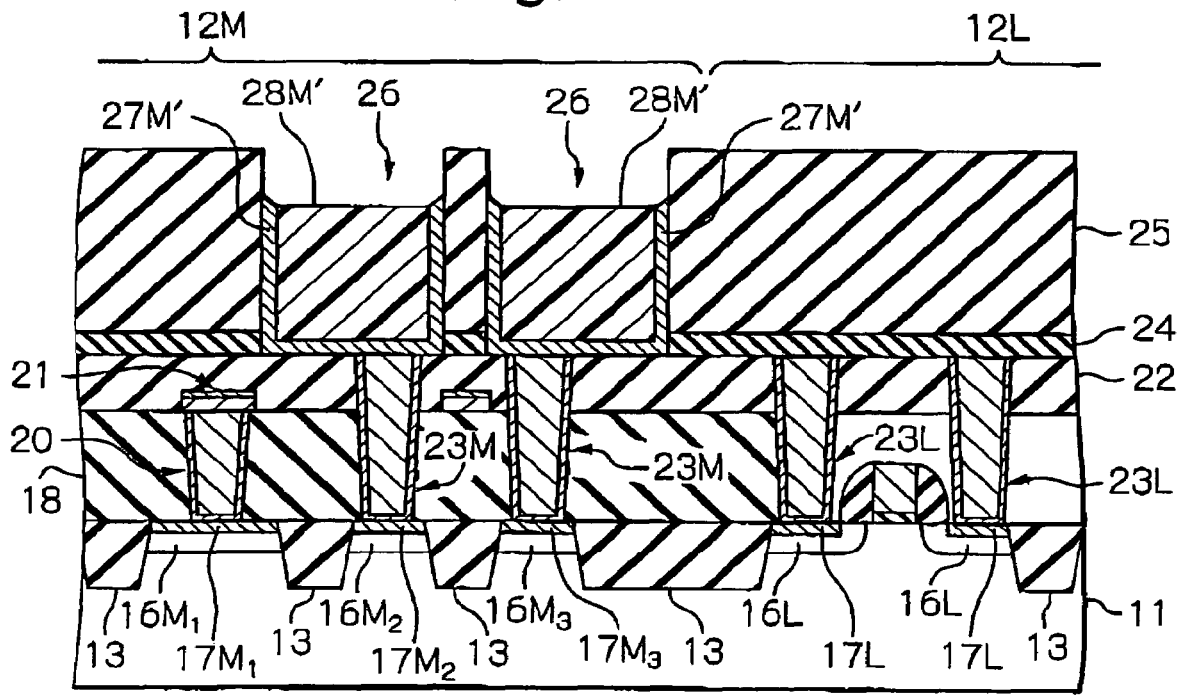

Next, as shown in FIG. 4B which corresponds to FIG. 2J, the titanium nitride layer 27 is etched back by using a dry etching process or anisotropic etching process, so that a titanium nitride layer or lower capacitor electrode 27M' is formed in each of the openings 26. After the formation of the lower capacitor electrodes 27M' is completed, the photoresist masks 28M' are removed from the openings 26.

Next, as shown in FIG. 4C which corresponds to FIG. 2K, a dielectric layer 29', which is composed of a high dielectric constant material such as tantalum oxide, is formed on the insulating interlayer 25 by using a CVD process so that the inner wall surfaces of the openings 26 are traversed by the dielectric layer or tantalum oxide layer 29'. Then, a titanium nitride layer $30_1'$ is formed on the tantalum oxide layer 29', and a tungsten layer $30_2'$ is formed on the titanium nitride layer $30_1'$ so that the openings 26 are filled with tungsten.

Next, as shown in FIG. 4D which corresponds to FIG. 2L, the tungsten, titanium nitride and tantalum oxide layer $30_2'$, $30_1'$ and 29' (see: FIG. 4C) are etched back so that the redundant materials of the tungsten, titanium nitride and tantalum oxide layer $30_2'$, $30_1'$ and 29' are removed from the surface of the insulating interlayer 25, and so that respective recesses 26' are defined at the locations of the openings 26 (see: FIG. 4C), resulting in formation of a tantalum oxide layer 29M', a titanium nitride layer $30M_1'$ and a tungsten layer $30M_2'$ in each of the openings 26 (see: FIG. 4C). The tantalum oxide layer 29M' serves as a capacitor dielectric layer, and both the titanium nitride layer $30M_1'$ and the tungsten layer $30M_2'$ define an upper capacitor electrode 30M'. In short, in each of the openings 26 (see: FIG. 2K), the lower capacitor electrode 27M', the capacitor dielectric layer 29M' and the upper capacitor electrode 30M' form a capacitor 31'.

Figure 4E:
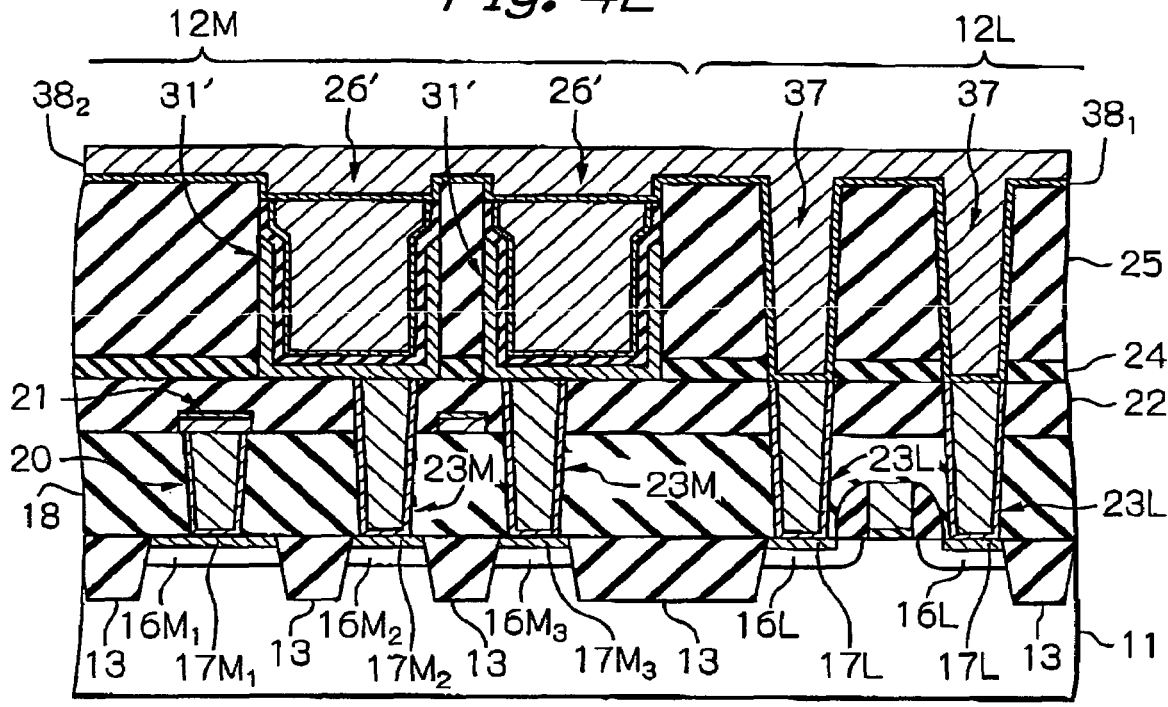

Next, as shown in FIG. 4E, holes 37 are formed in both the insulating interlayers 24 and 25 at the logic-circuit formation section 12L by using a photolithography and etching process, so that the upper faces of the logic-circuit-side contact structures 23L are exposed with the holes 37.

Then, a titanium nitride layer $38_1$ is formed on the insulating interlayer 25 so that inner wall surfaces of the recesses 26' and inner wall surfaces of the holes 37 are traversed by the titanium nitride layer $38_1$, and then a tungsten layer $38_2$ is formed on the titanium nitride layer $38_1$ so that the recesses 26' and the holes 37 are filled with tungsten. Note that the formation of the titanium nitride layer $38_1$ and the formation of the tungsten layer $38_2$ may be continuously carried out by using a CVD process or a sputtering process.

Figure 4F:
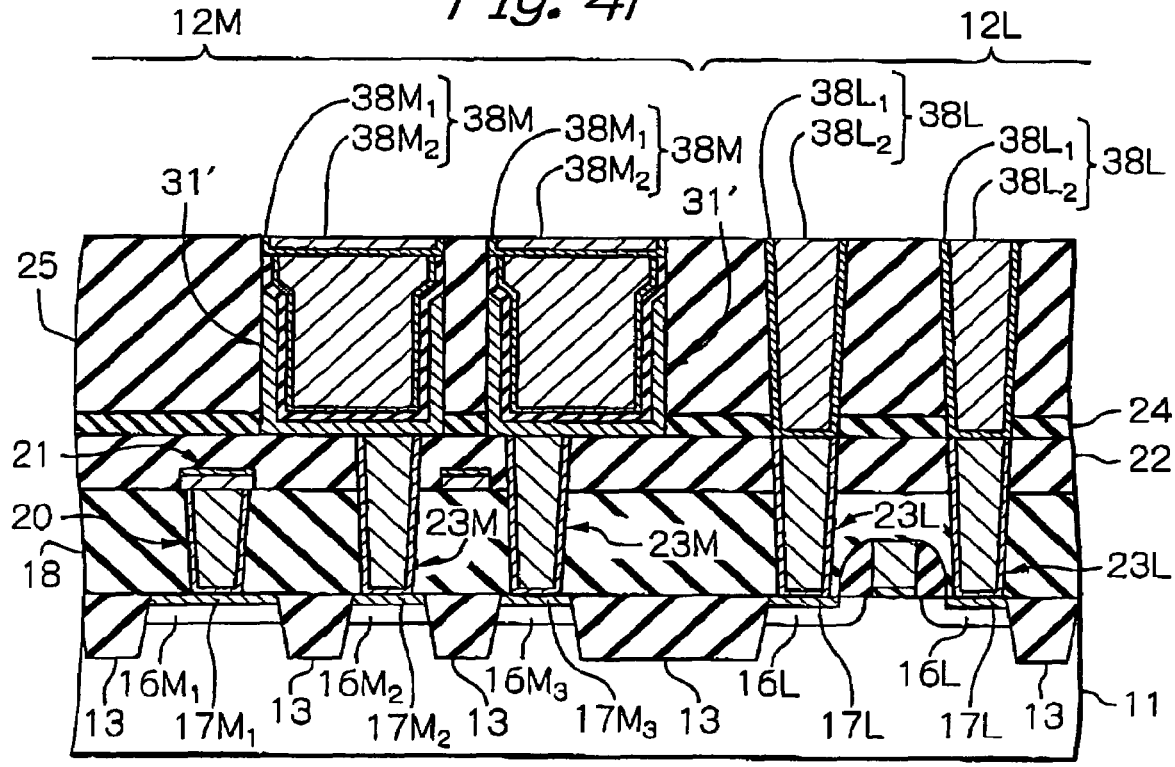

Next, as shown in FIG. 4F, both the tungsten layer $38_2$ and the titanium nitride layer $38_1$ are subjected to a CMP process in which the redundant materials of the tungsten and titanium nitride layers $38_2$ and $38_1$ are removed from the surface of the insulating interlayer 25, so that logic-circuit-side contact structures 38L are defined in both the insulating interlayers 24 and 25 at the logic-circuit formation section 12L, and so that capacitor conductive plugs 38M are defined in the respective recesses 26' (see: FIG. 4E). Namely, each of the logic-circuit-side contact structures 38L includes a titanium nitride layer $38L_1$ formed on the inner wall surface of the corresponding hole 37, and a tungsten layer $38L_2$ formed on the titanium nitride layer $38L_1$, and each of the capacitor conductive plugs 38M includes a titanium nitride layer $38M_1$ formed on the inner wall surface of the corresponding recesses 26' and a tungsten layer $38M_2$ formed on the titanium nitride layer $38M_1$.

Note that each of the capacitor conductive Chugs 38M is defined as an uppermost portion of the corresponding upper capacitor electrode 30M' with which an upper face of the capacitor dielectric layer 29M' is covered.

Next, as shown in FIG. 4G, a silicon nitride layer 39 and a silicon dioxide layer 40 are formed in order as insulating interlayers on the insulating interlayer 25 by using a CVD process and a CMP process. Then, signal-line layers 41L are formed in both the insulating interlayers 39 and 40 at the logic-circuit formation section 12L so as to be electrically connected to the respective logic-circuit-side contact structures 38L, and a common capacitor electrode layer 41M is formed in both the insulating interlayers 39 and 40 at the memory formation section 12M so as to be electrically connected to the capacitor conductive plugs 38M.

The formation of the signal-line layers 41L and the common capacitor electrode layer 41M may be carried out in a similar manner to that in the formation of the signal-line layers 36L and the common capacitor electrode layer 36M in the aforesaid first embodiment (see: FIGS. 2N to 2P). Namely, each of the signal-line layers 41L includes a titanium nitride layer $41L_1$ formed on an inner wall surface of a trench formed in both the insulating interlayers 39 and 40, and a tungsten layer $41L_2$ formed on the titanium nitride layer $41L_1$. Also, the common capacitor electrode layer 41M includes a titanium nitride layer $41M_1$ formed on an inner wall surface of a trench defined in both the insulating interlayers 39 and 40, and a tungsten layer $41M_2$ formed on the titanium nitride layer $41M_1$.

In the semiconductor device of FIG. 4G, in each of the signal-line layers 41L, both a tantalum nitride layer and a tantalum layer may be substituted for the titanium nitride layer $41L_1$, and a copper layer may be substituted for the tungsten layers $41L_2$. Both the tantalum nitride layer and the tantalum layer serves as a barrier metal layer $41L_1$ for preventing diffusion of copper atoms from the corresponding copper layer $41L_2$ into the insulating interlayers 39 and 40. Note that the same is true for the common capacitor electrode layer 41M.

As shown in FIG. 5 which is a partial plan view showing the memory formation section 12M of the semiconductor device of FIG. 4M, the common capacitor electrode layer 41M has a lattice-like configuration, and the capacitors 31' are regularly arranged so that an electrical connection is established between the common capacitor electrode layer 41M and the capacitor conductive plugs 38M of the capacitors 31'.

In FIG. 2P of the above-mentioned first embodiment, when the tungsten, titanium nitride and tantalum oxide layers $30_2$, $30_1$ and 29 are subjected to the CMP process to thereby form the tantalum oxide layer 29M, the titanium nitride layer $30M_1$ and the tungsten layer $30M_2$ in each of the openings 26 (see: FIGS. 2K and 2L), the polished upper face of the tantalum oxide layer or capacitor dielectric layer 29M may be subjected to corrosion due to an aqueous abrasive slurry used in the CMP process.

However, according to the second embodiment, the corrosion problem concerning the tantalum oxide layer or capacitor dielectric layer 29M' (see: FIG. 4D) can be completely prevented because the upper faces of the capacitor dielectric layers 29M' are covered with and protected by the respective capacitor conductive plugs 38M (see: FIG. 4F). Note, the thickness of the capacitor conductive plugs 38M may be on the order of 100 nm.

Third Embodiment

With reference to FIGS. 6A to 6I which are partial cross-sectional views, a third embodiment of the method for manufacturing a semiconductor device according to the present invention is explained below.

In the third embodiment, the same steps as those of FIG. 2A to FIG. 2F are executed.

Figure 6A:
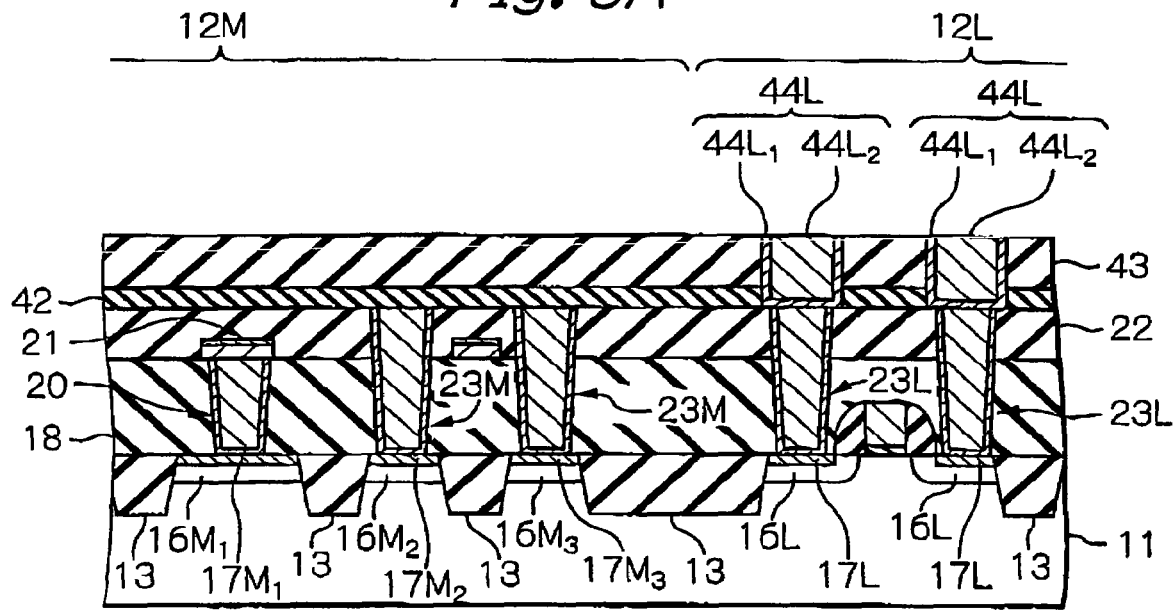
FIGS. 6A to 6I are cross-sectional views for explaining a third embodiment of the method for manufacturing a semiconductor device including a logic-circuit formation section and a memory formation section according to the present invention.

As shown in FIG. 6A, a silicon nitride layer 42 and a silicon dioxide layer 43 are formed in order as insulating interlayers on the insulating interlayer 22 by using a CVD process and a CMP process. Then, signal-line layers 44L are formed in both the insulating interlayers 42 and 43 at the logic-circuit formation section 12L so as to be electrically connected to the respective logic contact structures 23L. The formation of the signal-line layers 44L may be carried out in a similar manner to that in the formation of the signal-line layers 36L in the aforesaid first embodiment (see: FIGS. 2N to 2P). Namely, each of the signal-line layers 44L includes a titanium nitride layer $44L_1$ formed on an inner wall surface of a trench defined in both the insulating interlayers 42 and 43, and a tungsten layer $44L_2$ formed on the titanium nitride layer $44L_1$.

In each of the signal-line layers 44L, both a tantalum nitride layer and a tantalum layer may be substituted for the titanium nitride layer $44L_1$, and a copper layer may be substituted for the tungsten layers $44L_2$. Both the tantalum nitride layer and the tantalum layer serve as a barrier metal layer $44L_1$ for preventing diffusion of copper atoms from the corresponding copper layer $44L_2$ into the insulating interlayers 42 and 43.

Figure 6B:
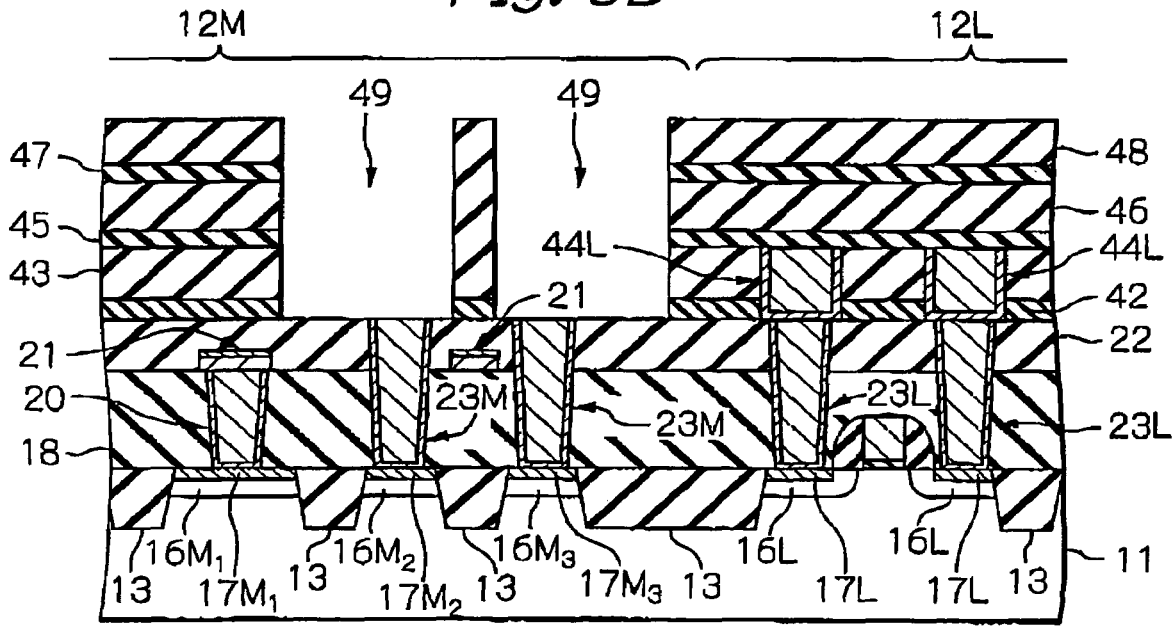

Next, as shown in FIG. 6B, a silicon nitride layer 45, a silicon dioxide layer 46, a silicon nitride layer 47 and a silicon dioxide layer 48 are formed in order as insulating interlayers on the insulating interlayer 43 by using a CVD process and a CMP process. Then, openings 49 for forming capacitors are defined in the insulating interlayers 48, 47, 46, 45, 43 and 42 at the memory formation section 12M by using a photolithography and etching process, so that upper faces of the capacitor contact structures 23M are exposed with the openings 49.

Figure 6C:
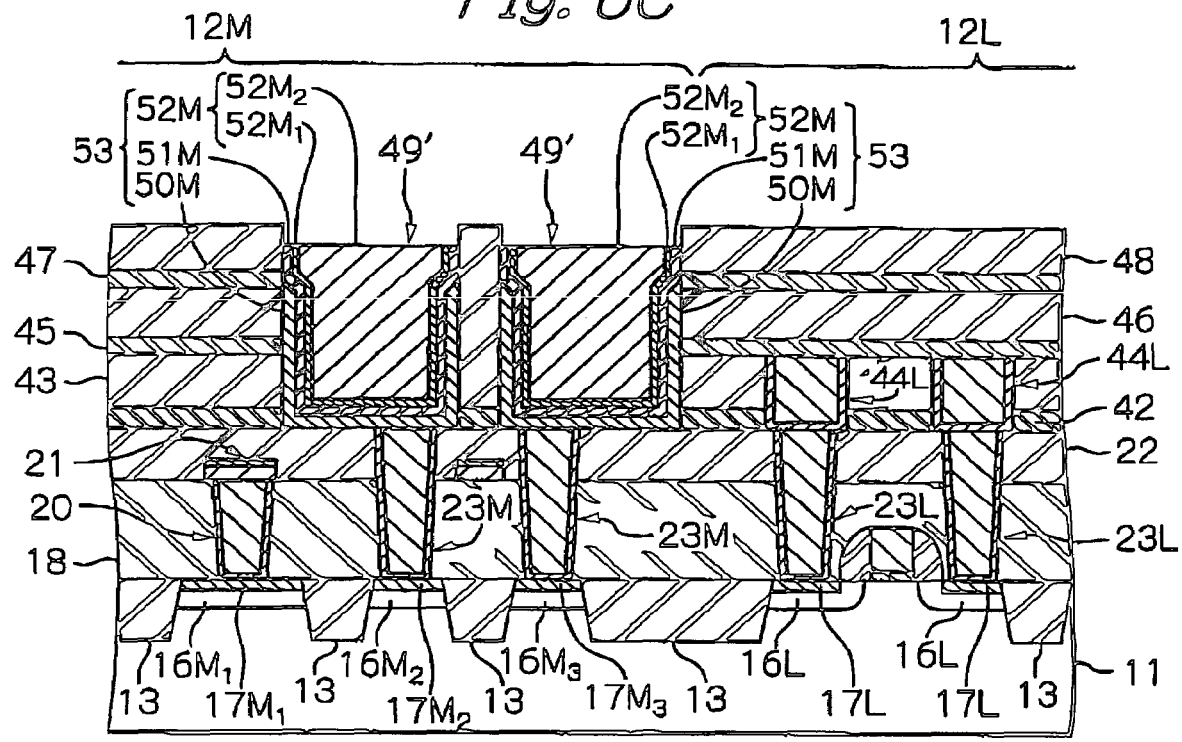

Next, as shown in FIG. 6C, a titanium nitride layer 50M, a tantalum oxide layer 51M, a titanium nitride layer $52M_1$ and a tungsten layer $52M_2$ are formed in each of the openings 49 (see: FIG. 6B) in a similar manner to that in the formation of the titanium nitride layer 27M', the tantalum oxide layer 29M', the titanium nitride layer $30M_1$' and the tungsten layer $30M_2$' in the above-mentioned second embodiment (see: FIGS. 4A to 4D), with respective recesses 49' are defined at the locations of the openings 49.

The titanium nitride layer 50M serves as a lower capacitor electrode, the tantalum oxide layer 51M serves as a capacitor dielectric layer, and both the titanium nitride layer $52M_1$ and the tungsten layer $52M_2$ define an upper capacitor electrode 52M. In short, in each of the openings 49 (see: FIG. 6B), the lower capacitor electrode 50M, the capacitor dielectric layer 51M and the upper capacitor electrode 52M form a capacitor 53.

Figure 6D:
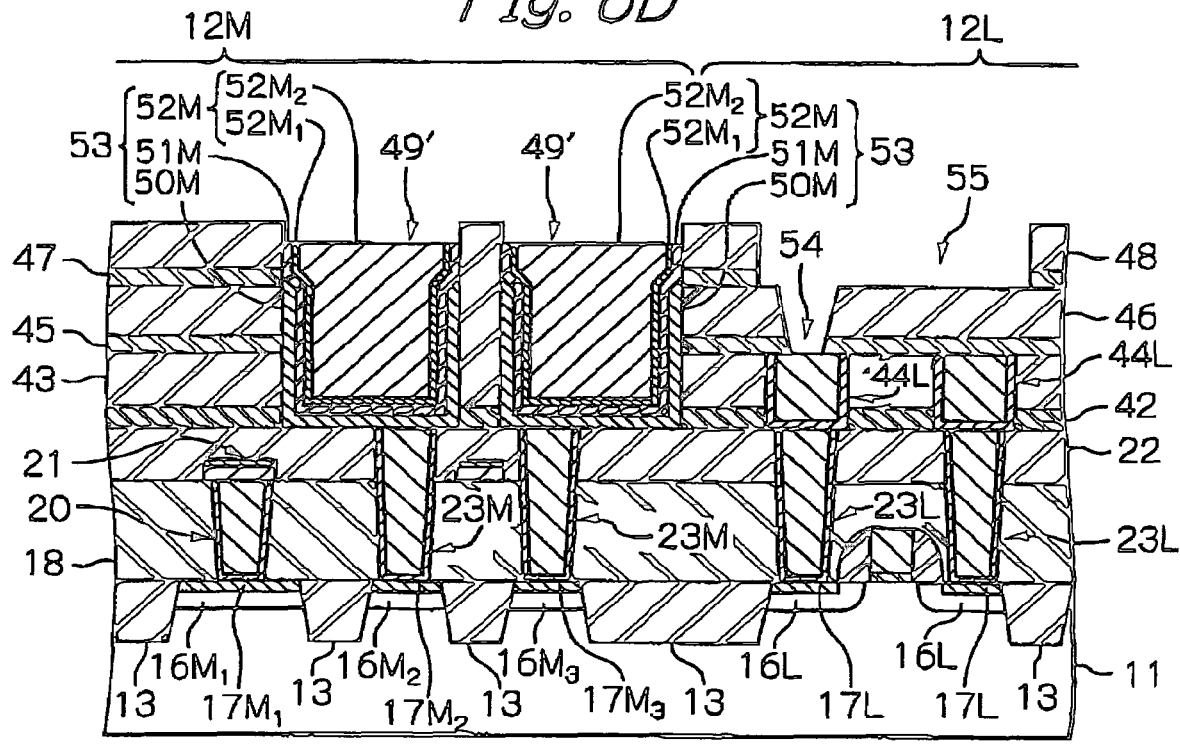

Next, as shown in FIG. 6D, a trench 54 for forming a signal-line layer is formed in both the insulating interlayers 47 and 48 at the logic-circuit formation section 12L. Then, a via hole 55 for forming a via plug is perforated in both the insulating interlayers 45 and 46 so as to be in communication with the trench 54, and a part of a predetermined signal-line layer 44L is exposed with the via hole 54. Note that the formation of the trench 54 and the perforation of the via holes 55 may be sequentially carried out by using a photolithography and etching process.

Figure 6E:
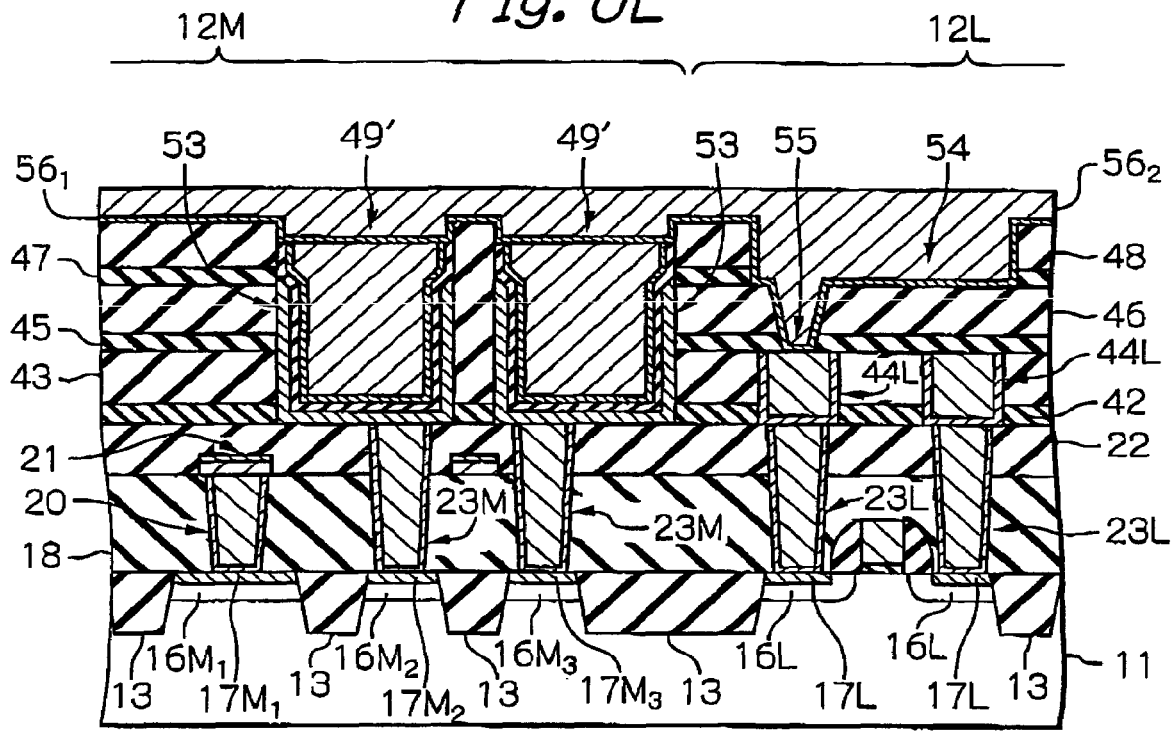

Next, as shown in FIG. 6E, a titanium nitride layer $56_1$ is formed on the insulating interlayer 48 so that inner wall surfaces of the recesses 49' and inner wall surfaces of both the via hole 54 and the trench 55 are traversed by the titanium nitride layer $56_1$, and then a tungsten layer $56_2$ is formed on the titanium nitride layer $56_1$ so that the recesses 29' and both the via hole 54 and the trench 55 are filled with tungsten. Note, the formation of the titanium nitride layer $56_1$ and the formation of the tungsten layer $56_2$ may be continuously carried out by using a CVD process or a sputtering process.

Figure 6F:
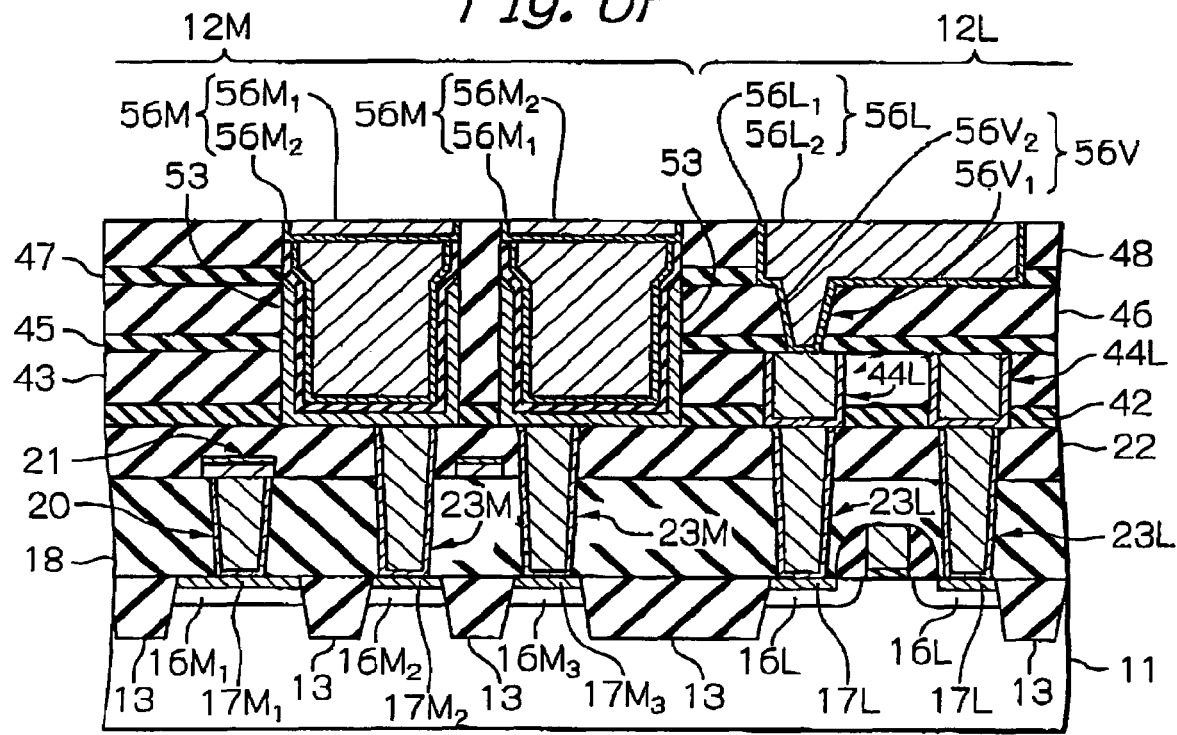

Next, as shown in FIG. 6F, both the tungsten layer $56_2$ and the titanium nitride layer $56_1$ are subjected to a CMP process in which the redundant materials of the tungsten and titanium nitride layers $56_2$ and $56_1$ are removed from the surface of the insulating interlayer 48, so that a signal-line layer 56L is defined in the trench 55 (see: FIG. 6E), and so that capacitor conductive plugs 56M are defined in the respective recesses 49' (see: FIG. 6E). Namely, the signal-line layer 56L includes a titanium nitride layer $56L_1$ formed on the inner wall surface of the trench 55 (see: FIG. 6E), and a tungsten layer $56L_2$ formed on the titanium nitride layer $56L_1$, and each of the capacitor conductive plugs 56M includes a titanium nitride layer $56M_1$ formed on the inner wall surface of the corresponding recesses 49' (see: FIG. 6E), and a tungsten layer $56M_2$ formed on the titanium nitride layer $56M_1$.

Note that the signal-line layer 56L is electrically connected to a predetermined signal-line layer 44L through a via plug 56V, which includes a titanium nitride layer $56V_1$ formed on the inner wall surface of the via hole 54 (see: FIG. 6E), and a tungsten layer $56V_2$ formed on the titanium nitride layer $56V_1$.

Similar to the capacitor conductive plugs 38H of FIG. 4F, each of the capacitor conductive plugs 56M is defined as an uppermost Portion of the corresponding upper capacitor electrode 52M with which an upper face of the capacitor dielectric layer 51M is covered.

In the signal-line layer 56 with the via plug 56V, both a tantalum nitride layer and a tantalum layer may be substituted for the titanium nitride layers $56L_1$ and $56V_1$, and a copper layer may be substituted for the tungsten layers $44L_2$. Both the tantalum nitride layer and the tantalum layer serve as a barrier metal layer $56L_1/56V_1$ for preventing diffusion of copper atoms from the corresponding copper layer $56L_2/56V_2$ into the insulating interlayers 42 and 43. In this case, of course, in each of the capacitor conductive plugs 56M, both a tantalum nitride layer and a tantalum layer are substituted for the titanium nitride layer $56M_1$, and a copper layer is substituted for the tungsten layer $56M_2$.

Figure 6G:
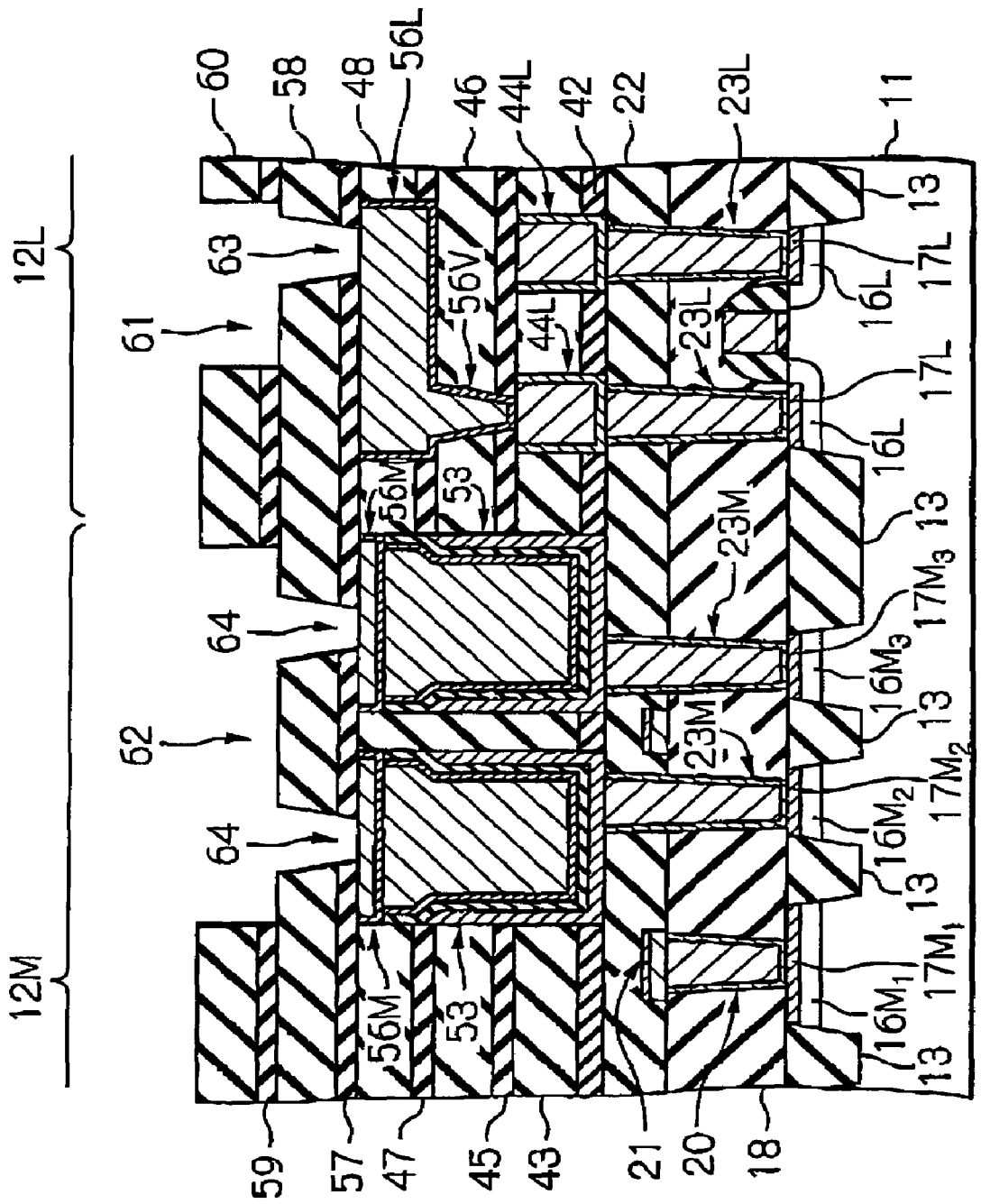

Next, as shown in FIG. 6G, a silicon nitride layer 57, a silicon dioxide layer 58, a silicon nitride layer 59 and a silicon dioxide layer 60 are formed in order as insulating interlayers on the insulating interlayer 47 by using a CVD process and a CMP process.

Then, a trench 61 forming a signal-line layer is formed in both the insulating interlayers 59 and 60 at the logic-circuit formation section 12L, and a trench 62 forming a common capacitor electrode layer is formed in both the insulating interlayers 59 and 60 at the memory formation section 12M. Note that the formation of the trenches 61 and 62 may be simultaneously carried out by using a photolithography and etching process.

Subsequently, a via hole 63 for forming a via plug is perforated in both the insulating interlayers 57 and 58 at the logic-circuit-formation section 12L so as to be in communication with the trench 61, and a part of the signal-line layer 56L is exposed with the via hole 63. Also, via holes 64 for forming via plugs are perforated in both the insulating interlayers 57 and 58 at the memory formation section 12M so as to be in communication with the trench 62, and parts of the respective capacitor conductive plugs 56M are exposed with the via holes 64. Note that the perforation of the via holes 63 and 64 may be simultaneously carried out by using a photolithography and etching process.

Figure 6H:
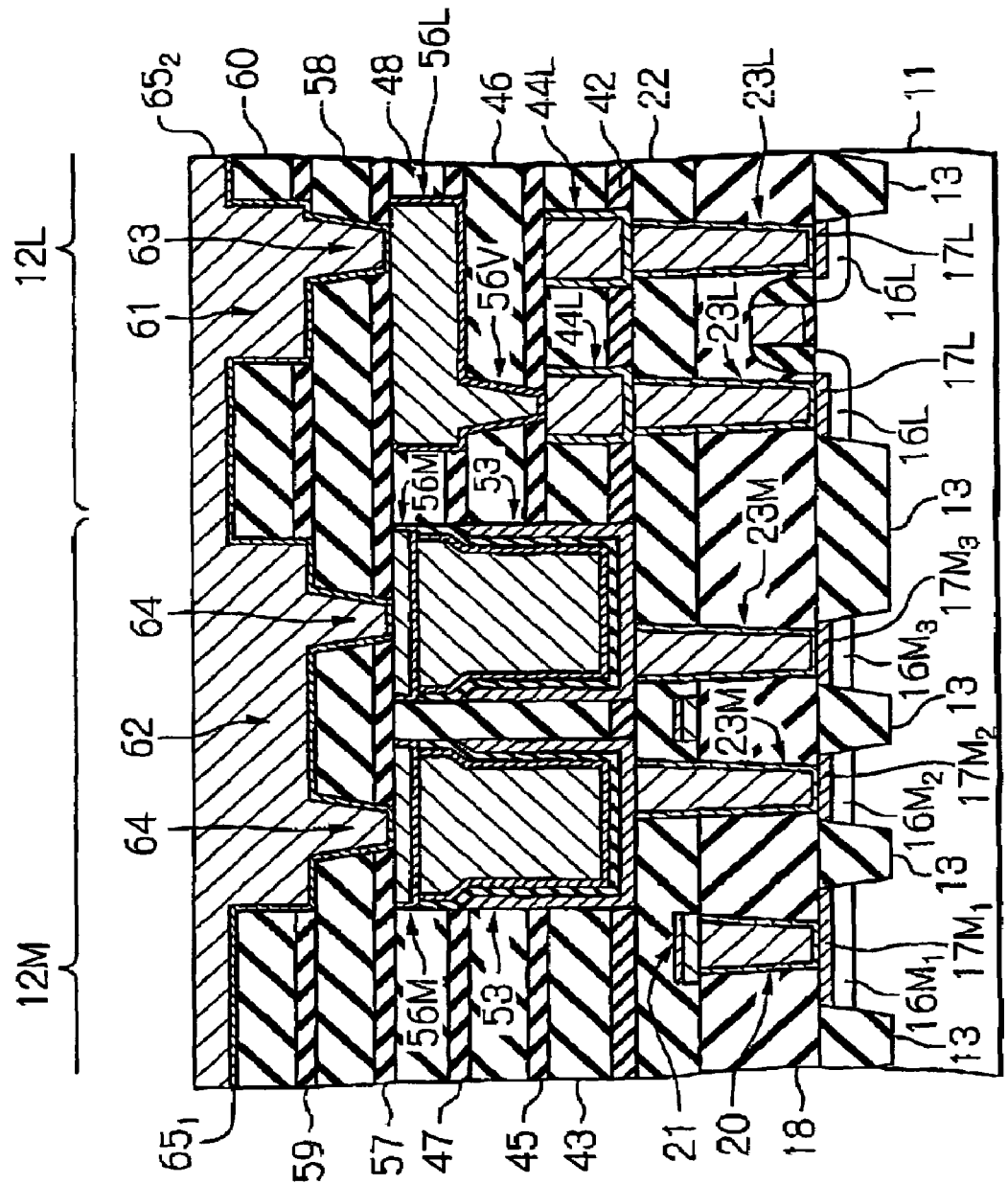

Next, as shown in FIG. 6H, a titanium nitride layer $65_1$ is formed on the insulating interlayer 60 so that inner wall surfaces of the via holes 61 and 63 and inner wall surfaces of trenches 62 and 64 are traversed by the titanium nitride layer $65_1$, and then a tungsten layer $65_2$ is formed on the titanium nitride layer $65_1$ so that the via holes 61 and 63 and the trenches 62 and 64 are filled with tungsten. Note, the formation of the titanium nitride layer $65_1$ and the formation of the tungsten layer 652 may be continuously carried out by using a CVD process or a sputtering process.

Figure 6I:
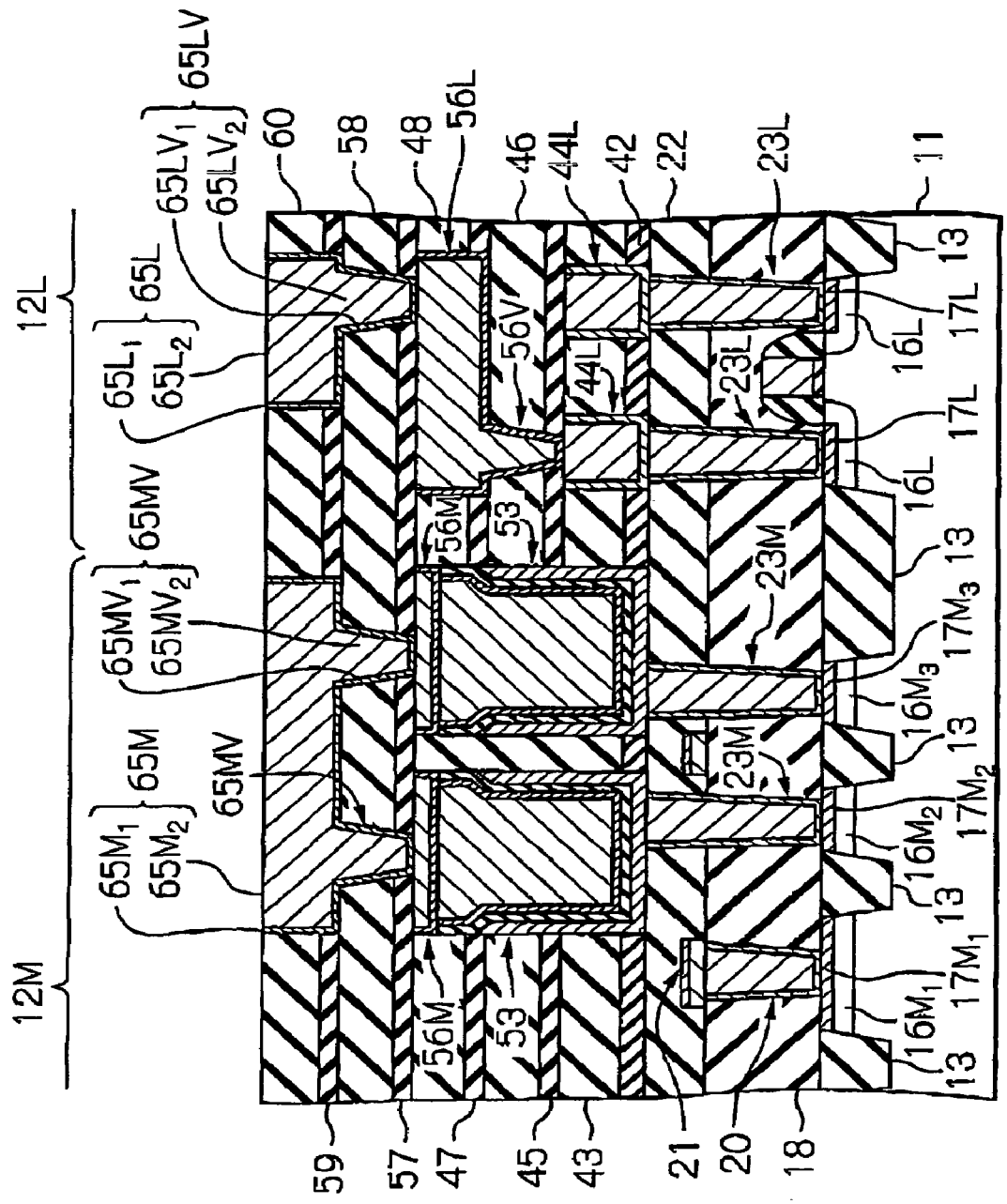

Next, as shown in FIG. 6I, both the tungsten layer $65_2$ and the titanium nitride layer $65_1$ are subjected to a CMP process in which the redundant materials of the tungsten and titanium nitride layers $65_2$ and $65_1$ are removed from the surface of the insulating interlayer 60, so that a signal-line layer 65L is defined in the trench 61 (see: FIG. 6H), and so that a common capacitor electrode layer 65H is defined in the trench 62 (see: FIG. 6H). Namely, the signal-line layer 65L includes a titanium nitride layer $65L_1$ formed on the inner wall surface of the trench 61 (see: FIG. 6H), and a tungsten layer $65L_2$ formed on the titanium nitride layer $65L_1$, and the common capacitor electrode layer 65M includes a titanium nitride layer $65M_1$ formed on the inner wall surface of the trench 62 (see: FIG. 6H), and a tungsten layer $65M_2$ formed on the titanium nitride layer $65M_1$.

Note that the signal-line layer 65L is electrically connected to the signal-line layer 56L through a via plug 65LV, which includes a titanium nitride layer $65LV_1$ formed on the inner wall surface of the via hole 63 (see: FIG. 6H), and a tungsten layer $65LV_2$ formed on the titanium nitride layer $65LV_1$. Also, the common capacitor electrode layer 65M is electrically connected to the capacitor conductive plugs 56M through respective via plugs 65MV, each of which includes a titanium nitride layer $65MV_1$ formed on the inner wall surface of the corresponding via hole 64 (see: FIG. 6H), and a tungsten layer $65MV_2$ formed on the titanium nitride layer $65MV_1$.

In the semiconductor device of FIG. 6I, in the signal-line layer 65L with the via plug 65LV, both a tantalum nitride layer and a tantalum layer may be substituted for the titanium nitride layers $65L_1$ and $65LV_1$, and a copper layer may be substituted for the tungsten layers $65L_2$ and $65LV_2$. Both the tantalum nitride layer and the tantalum layer serve as a barrier metal layer $65L_1/65LV_1$ for preventing diffusion of copper atoms from the copper layer $65L_2/65LV_2$ into the insulating interlayers 59 and 60. Note that the same is true for the common capacitor electrode layer 41M with the via plugs 65MV.

Figure 7:
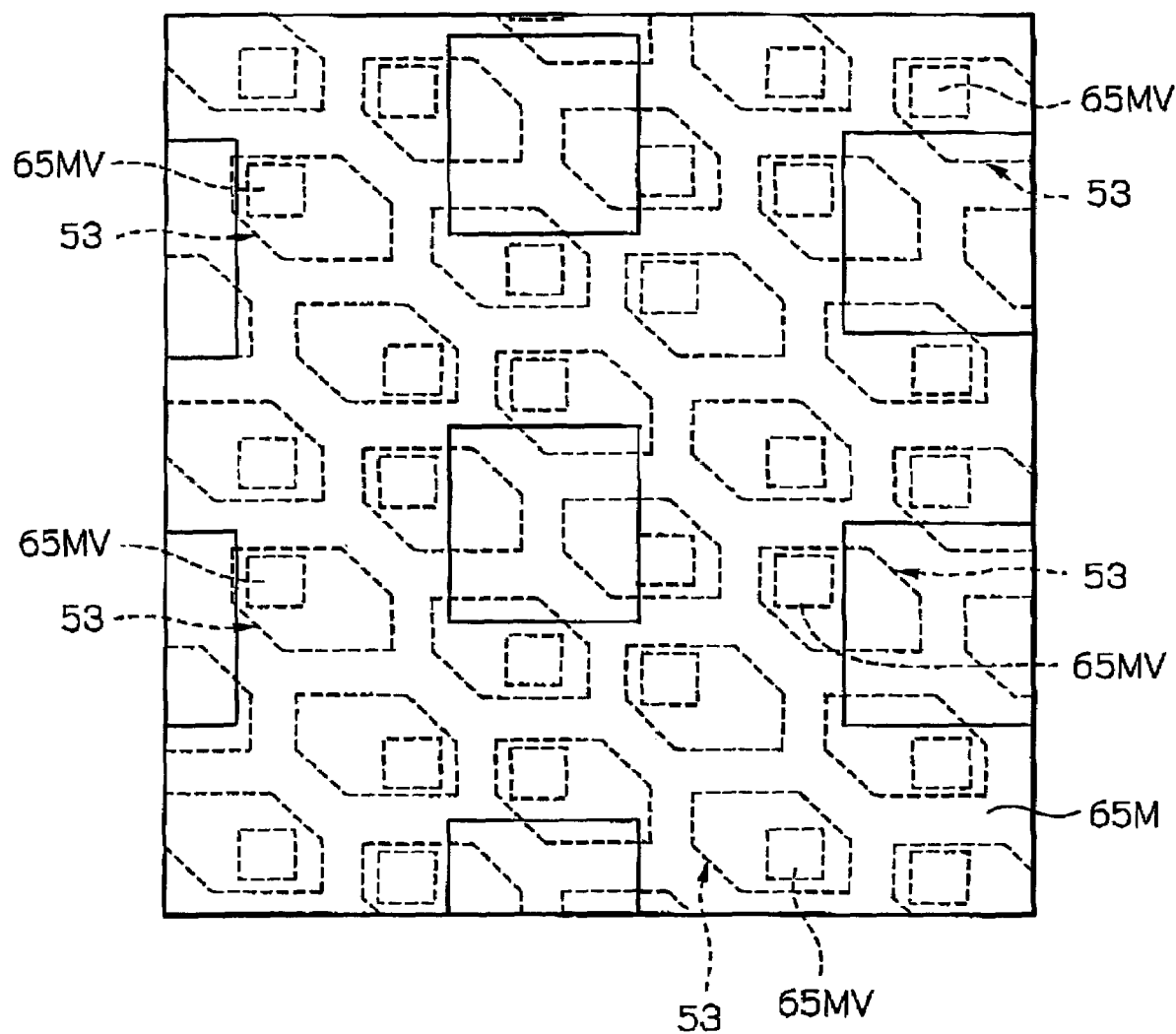
FIG. 7 is a plan view showing a part of the memory section of the semiconductor device of FIG. 6I.

As shown in FIG. 7 which is a partial plan view showing the memory formation section 12M of the semiconductor device of FIG. 6I, the common capacitor electrode layer 65M has a lattice-like configuration, and the capacitors 53 are regularly arranged so that the common capacitor electrode layer 65M is electrically connected to the capacitor conductive plugs 56M through the intermediary of the via plugs 65MV.

In the third embodiment, although the capacitors 53 is formed in the same manner as in the above-mentioned second embodiment, the capacitors 53 may be formed in the same manner as in the above-mentioned first embodiment (see: FIGS. 2G to 2L).

As well known, in general, when a metal layer having a large area is flattened by using a CMP process, a surface of the metal layer tends to be undulated. Namely, before the surface of the metal layer can be prevented from being undulated, the CMP process must be carefully carried out. For example, in the prior art semiconductor device of FIG. 1, it is necessary to carefully polish by the tungsten layer 119 before the surface of the tungsten layer 119 can be flattened.

On the other hand, in the above-mentioned first, second and third embodiments, it is possible to easily flatten the surface of the common capacitor electrode layer 36M, 41M or 65M by using a CMP process due to the lattice-like configuration thereof.

Finally, it will be understood by those skilled in the art that the foregoing description is of preferred embodiments of the device and the method, and that various changes and modifications may be made to the present invention without departing from the spirit and scope thereof.

The invention claimed is:

1. A semiconductor device comprising:
a semiconductor substrate which is sectioned into a logic-circuit formation section in which a plurality of logic circuits are formed and a memory formation section in which a plurality of memory cells are formed; and
a multi-layered insulating layer formed on said semiconductor substrate, said multi-layered insulating layer comprising:
a conductive structure formed in said multi-layered insulating layer at said logic-circuit formation section;
a plurality of capacitors formed in said multi-layered insulating layer at said memory formation section, said plurality of capacitors comprising:
a lower capacitor electrode;
a capacitor dielectric layer formed on said lower capacitor electrode; and
an upper capacitor electrode formed on said capacitor dielectric layer, said upper capacitor electrode having an uppermost portion that is coplanar with an uppermost portion of said capacitor dielectric layer;
a plurality of lower-side connection layers formed below the lower capacitor electrode of said plurality of capacitors at said memory formation section;
a logic-circuit-side connection layer formed on or above said conductive structure at said logic-circuit formation section such that the logic-circuit-side connection layer is electrically connected to said conductive structure;
a common capacitor electrode layer formed at the memory formation section on or above said plurality of capacitors such that said common capacitor electrode layer is electrically connected to the upper capacitor electrode of said plurality of capacitors; and
a capacitor conductive plug covering said uppermost portion of said upper capacitor electrode and said uppermost portion of said capacitor dielectric layer and disposed between said common capacitor electrode and said plurality of capacitors.

2. The semiconductor device as set forth in claim 1, wherein said conductive structure comprises a contact structure.

3. The semiconductor device as set forth in claim 2, wherein a height of said contact structure is equivalent to a height of said plurality of capacitors.

4. The semiconductor device as set forth in claim 1, wherein said conductive structure comprises:
a first signal-line layer and a second signal-line layer positioned above said first signal-line layer; and
a via plug formed above said first signal-line layer and electrically connected to said second signal-line layer.

5. The semiconductor device as set forth in claim 4, wherein a combination of said first and second signal-line layer and said via plug has a height that is equivalent to a height of said plurality of capacitors.

6. The semiconductor device as set forth in claim 1, wherein said plurality of lower-side connection layers comprises a plurality of bit-line layers.

7. The semiconductor device as set forth in claim 1, wherein said logic-circuit-side connection layer comprises a signal-line layer.

8. The semiconductor device as set forth in claim 1, wherein said common capacitor electrode layer is directly and electrically connected to said capacitor conductive plug, and
wherein said capacitor conductive plug electrically connects said common capacitor electrode layer to the upper capacitor electrode of said plurality of capacitors.

9. The semiconductor device as set forth in claim 8, wherein said common capacitor electrode layer has a lattice-like configuration.

10. The semiconductor device as set forth in claim 7, wherein said common capacitor electrode layer comprises a plurality of via plugs formed on a lower face of said common capacitor electrode layer, said common capacitor electrode layer being electrically connected to the upper capacitor electrode of said plurality of capacitors through an intermediary of said plurality of via plugs.

11. A semiconductor device comprising a multi-layered insulating layer formed on a semiconductor substrate, said multi-layer insulating layer comprising:
   a memory formation section in which a plurality of memory cells are formed, said memory formation section comprising:
      a plurality of capacitors, comprising:
         a lower capacitor electrode;
         a capacitor dielectric layer formed on said lower capacitor electrode; and
         an upper capacitor electrode formed on said capacitor dielectric layer, said upper capacitor electrode having an uppermost portion that is coplanar with an uppermost portion of said capacitor dielectric layer;
      a plurality of lower-side connection layers formed below the lower capacitor electrode;
      a common capacitor electrode layer formed on or above said plurality of capacitors such that said common capacitor electrode layer is electrically connected to the upper capacitor electrode; and
      a capacitor conductive plug covering said uppermost portion of said upper capacitor electrode and said uppermost portion of said capacitor dielectric layer and disposed between said common capacitor electrode and said plurality of capacitors; and
   a logic-circuit formation section in which a plurality of logic circuits are formed, said logic-circuit formation section comprising:
      a conductive structure formed in said logic-circuit formation section; and
      a logic-circuit-side connection layer formed on or above said conductive structure such that the logic-circuit-side connection layer is electrically connected to said conductive structure.

12. The semiconductor device as set forth in claim 11, wherein said common capacitor electrode layer is formed above and electrically connected to said capacitor conductive plug.

13. The semiconductor device as set forth in claim 11, wherein said capacitor conductive plug comprises:
   a first plug layer covering said uppermost portion of said upper capacitor electrode and said uppermost portion of said capacitor dielectric layer; and
   a second plug layer formed on said first plug layer, wherein said first plug layer has an uppermost portion that is coplanar with an uppermost portion of said second plug layer.

14. The semiconductor device as set forth in claim 12, wherein said multi-layered insulating layer further comprises a plurality of insulating interlayers formed above said capacitor conductive plug and surrounding said common capacitor electrode layer.

15. The semiconductor device as set forth in claim 14, wherein said plurality of insulating layers have an uppermost portion that is coplanar to an uppermost portion of said common capacitor electrode.

16. The semiconductor device as set forth in claim 13, wherein said multi-layered insulating layer further comprises a plurality of insulating interlayers formed above said capacitor conductive plug and surrounding said common capacitor electrode layer, and
   wherein said plurality of insulating interlayers are formed on said uppermost portion of said first plug layer and said uppermost portion of said second plug layer.

17. The semiconductor device as set forth in claim 13, wherein said first plug layer comprises titanium nitride, and wherein said second plug layer comprises tungsten.

18. The semiconductor device as set forth in claim 4, wherein said conductive structure further comprises:
   a third-signal line layer positioned above said second signal-line layer; and
   a second via plug formed above said second signal-line layer, electrically connected to said third signal-line layer, and electrically connecting said second signal-line layer and said third signal-line layer.

19. The semiconductor device as set forth in claim 11, wherein said common capacitor electrode layer is electrically connected to said capacitor conductive plug by a via plug.

20. The semiconductor device as set forth in claim 13, wherein said conductive structure comprises:
   a first conductive layer having an uppermost portion being coplanar with an uppermost portion of said second plug layer, the first conductive layer comprised of a material that comprises said second plug layer; and
   a second conductive layer covering a sidewall and a bottom of said first conductive layer and having an uppermost portion being coplanar with the uppermost portion of said first conductive layer, the second conductive layer comprised of a material that comprises said first plug layer.

* * * * *